United States Patent
Sugiura et al.

(10) Patent No.: US 10,991,868 B2
(45) Date of Patent: Apr. 27, 2021

(54) THERMOELECTRIC CONVERSION ELEMENT

(71) Applicant: FUJIFILM Corporation, Tokyo (JP)

(72) Inventors: Hiroki Sugiura, Ashigara-kami-gun (JP); Yoshinori Kanazawa, Ashigara-kami-gun (JP); Kimiatsu Nomura, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 198 days.

(21) Appl. No.: 16/223,227

(22) Filed: Dec. 18, 2018

(65) Prior Publication Data

US 2019/0112192 A1 Apr. 18, 2019

Related U.S. Application Data

(63) Continuation of application No. PCT/JP2017/024700, filed on Jul. 5, 2017.

(30) Foreign Application Priority Data

Jul. 11, 2016 (JP) .............................. JP2016-136826

(51) Int. Cl.
*H01L 35/24* (2006.01)
*H01L 35/22* (2006.01)
(Continued)

(52) U.S. Cl.
CPC .............. *H01L 35/24* (2013.01); *H01L 35/14* (2013.01); *H01L 35/22* (2013.01); *H01L 35/04* (2013.01)

(58) Field of Classification Search
CPC .................... H01L 35/00–34; H01L 35/12–26
See application file for complete search history.

(56) References Cited

U.S. PATENT DOCUMENTS

2009/0022650 A1  1/2009 Choi et al.
2013/0312806 A1* 11/2013 Carroll .................... H02S 10/10
                                                        136/212
(Continued)

FOREIGN PATENT DOCUMENTS

JP  2009-23906 A  2/2009
JP  2013-95820 A  5/2013
(Continued)

OTHER PUBLICATIONS

Kim, et al. "Transparent organic P-Dopant in carbon nanotubes: Bis (trifluoromethanesulfonyl) imide." Acs Nano 4.11 (2010): 6998-7004.*
(Continued)

*Primary Examiner* — William E McClain
(74) *Attorney, Agent, or Firm* — Sughrue Mion, PLLC

(57) ABSTRACT

An object of the present invention is to provide a thermoelectric conversion element which includes a p-type thermoelectric conversion layer and an n-type thermoelectric conversion layer, has excellent power generation capacity and durability, and inhibits a variation in power generation capacity between lots.
The thermoelectric conversion element of the present invention is a thermoelectric conversion element having a p-type thermoelectric conversion layer and an n-type thermoelectric conversion layer electrically connected to the p-type thermoelectric conversion layer, in which the p-type thermoelectric conversion layer contains a nanocarbon material and at least one kind of component selected from the group consisting of an onium salt and an inorganic salt, the n-type thermoelectric conversion layer contains a nanocarbon material and an onium salt, and a difference between an ionization potential of the p-type thermoelectric conversion
(Continued)

layer and an ionization potential of the n-type thermoelectric conversion layer is equal to or smaller than 0.15 eV.

15 Claims, 2 Drawing Sheets

(51) Int. Cl.
　　　*H01L 35/14*　　　(2006.01)
　　　*H01L 35/04*　　　(2006.01)

(56) References Cited

U.S. PATENT DOCUMENTS

| | | | | |
|---|---|---|---|---|
| 2014/0087164 | A1* | 3/2014 | LeMieux | H01L 31/1884 428/220 |
| 2015/0380625 | A1 | 12/2015 | Freer et al. | |
| 2016/0104829 | A1 | 4/2016 | Hayashi et al. | |
| 2017/0110646 | A1 | 4/2017 | Nonoguchi et al. | |
| 2017/0197836 | A1* | 7/2017 | Nonoguchi | H01L 35/22 |
| 2018/0194629 | A1* | 7/2018 | Avery | H01L 27/16 |

FOREIGN PATENT DOCUMENTS

| | | |
|---|---|---|
| JP | 2015-12236 A | 1/2015 |
| JP | 2016-9851 A | 1/2016 |
| JP | 2016-513369 A | 5/2016 |

OTHER PUBLICATIONS

Nakano, et al. "Solid-state, individual dispersion of single-walled carbon nanotubes in ionic liquid-derived polymers and its impact on thermoelectric properties." RSC advances 6.3 (2016): 2489-2495.*
Nonoguchi, et al. "Simple salt-coordinated n-type nanocarbon materials stable in air." Advanced Functional Materials 26.18 (2016): 3021-3028.*
Li, et al. "Doping of Fullerenes via Anion-Induced Electron Transfer and Its Implication for Surfactant Facilitated High Performance Polymer Solar Cells." Advanced materials 25.32 (2013): 4425-4430.*
Sugiura, et al. "Fine tuning of the Fermi level of single-walled carbon nanotubes with onium salts and application for thermoelectric materials." Synthetic Metals 259 (2020): 116222.*
Notice of Reasons for Refusal dated Jan. 7, 2020 issued by the Japanese Patent Office in counterpart Application No. 2018-527547.
Nonoguchi, et al., "Systematic Conversion of Single Walled Carbon Nanotubes into n-type Thermoelectric Materials by Molecular Dopants", Scientific Reports, Nov. 26, 2013, p. 1-7, 3:3344 (7 pages total).
International Search Report, issued by International Searching Authority in corresponding International Application No. PCT/JP2017/024700, dated Aug. 29, 2017.
International Preliminary Report on Patentability with a Translation of Written Opinion issued from the International Bureau in counterpart International Application No. PCT/JP2017/024700, dated Jan. 15, 2019.
Written Opinion issued by the International Bureau in corresponding International Application No. PCT/JP2017/024700, dated Aug. 29, 2017.

* cited by examiner

THERMOELECTRIC CONVERSION ELEMENT

CROSS-REFERENCE TO RELATED APPLICATIONS

This application is a Continuation of PCT International Application No. PCT/JP2017/024700 filed on Jul. 5, 2017, which claims priority under 35 U.S.C. § 119(a) to Japanese Patent Application No. 2016-136826 filed on Jul. 11, 2016. The above application is hereby expressly incorporated by reference, in its entirety, into the present application.

BACKGROUND OF THE INVENTION

1. Field of the Invention

The present invention relates to a thermoelectric conversion element.

2. Description of the Related Art

Thermoelectric conversion materials that enable the interconversion of thermal energy and electric energy are used in power generating elements generating electric power from heat or thermoelectric conversion elements such as a Peltier element. Thermoelectric conversion elements can convert thermal energy directly into electric power, and do not require a moving portion. Therefore, the thermoelectric conversion elements are used in, for example, wristwatches operating by body temperature, power supplies for backwoods, aerospace power supplies, and the like.

As one of the typical constitutions of the thermoelectric conversion elements, for example, there is a constitution in which a p-type thermoelectric conversion layer and an n-type thermoelectric conversion layer are electrically connected to each other. Generally, as the material of the n-type thermoelectric conversion layer, inorganic materials such as nickel are known. However, the inorganic materials have problems in that the materials are expensive, contain harmful substances, and need to undergo a complicated working process to become a thermoelectric conversion element.

Therefore, in recent years, techniques using carbon materials represented by carbon nanotubes (hereinafter, referred to as "CNT" as well) have been suggested. For example, JP2016-009851A discloses a technique of preparing an n-type thermoelectric conversion layer by reducing CNT by using an onium salt having a specific structure as a dopant.

SUMMARY OF THE INVENTION

Meanwhile, in recent years, in order to improve the performance of instruments using thermoelectric conversion elements, further improvement of the thermoelectric conversion performance of the thermoelectric conversion elements has been required.

Based on the description in JP2016-009851A, the inventors of the present invention prepared a thermoelectric conversion element by using an n-type thermoelectric conversion layer, which is obtained by adding a tetrabutylammonium hydroxide salt (onium salt) to CNT, and a p-type thermoelectric conversion layer formed of undoped CNT, and evaluated the characteristics of the thermoelectric conversion element. As a result, the inventors have found that the power generation capacity thereof needs to be further ameliorated.

Furthermore, the thermoelectric conversion element is required to result in only a small reduction in power generation capacity even after being stored in a high-temperature environment. That is, the thermoelectric conversion element is required to exhibit excellent durability.

In addition, for the thermoelectric conversion element, in view of manufacturing yield, it is required that even in a case where a plurality of thermoelectric conversion elements are manufactured, a variation in the power generation capacity among the elements is small.

However, the thermoelectric conversion element prepared based on JP2016-009851A exhibited poor durability, and in a case where a plurality of the thermoelectric conversion elements were manufactured, a great variation in the power generation capacity was found among the elements.

The present invention has been made in consideration of the circumstances described above, and an object thereof is to provide a thermoelectric conversion element which includes a p-type thermoelectric conversion layer and an n-type thermoelectric conversion layer, has excellent power generation capacity and durability, and inhibits a variation in the power generation capacity between lots.

Regarding the aforementioned object, the inventors of the present invention conducted a thorough examination. As a result, the inventors have found that by adjusting a difference between an ionization potential of a p-type thermoelectric conversion layer and an ionization potential of an n-type thermoelectric conversion layer, the desired effects are obtained.

More specifically, the inventors have found that the aforementioned object can be achieved by the following constitution.

(1) A thermoelectric conversion element comprising a p-type thermoelectric conversion layer and an n-type thermoelectric conversion layer electrically connected to the p-type thermoelectric conversion layer, in which the p-type thermoelectric conversion layer contains a nanocarbon material and at least one kind of component selected from the group consisting of an onium salt and an inorganic salt, the n-type thermoelectric conversion layer contains a nanocarbon material and an onium salt, and a difference between an ionization potential of the p-type thermoelectric conversion layer and an ionization potential of the n-type thermoelectric conversion layer is equal to or smaller than 0.15 eV.

(2) The thermoelectric conversion element described in (1), in which the onium salt contained in the p-type thermoelectric conversion layer is at least one kind of onium salt selected from the group consisting of an onium salt represented by Formula (1A) which will be described later to an onium salt represented by Formula (1D) which will be described later or a polymer having a residue obtained by removing one hydrogen atom from at least one kind of onium salt selected from the group consisting of the onium salt represented by Formula (1A) to the onium salt represented by Formula (1D), a pKa of a conjugate acid of an anion of the inorganic salt is equal to or lower than −3, and the onium salt contained in the n-type thermoelectric conversion layer is an onium salt represented by Formula (2) which will be described later.

(3) The thermoelectric conversion element described in (2), in which the p-type thermoelectric conversion layer contains at least one kind of component selected from the group consisting of an onium salt represented by Formula (1A) in which $Z^{11}$ represents a nitrogen atom, an onium salt represented by Formula (1B) in which $Z^{12}$ represents a nitrogen atom, an onium salt represented by Formula (1C) in which $Z^{13}$ represents a nitrogen atom, an onium salt represented by Formula (1D), and an inorganic salt containing an anion whose conjugate acid has a pKa equal to or lower than −3.

(4) The thermoelectric conversion element described in (2) or (3), in which $Z^{21}$ of the onium salt represented by Formula (2) is a nitrogen atom.

(5) The thermoelectric conversion element described in any one of (2) to (4), in which a pKa of a conjugate acid of an anion represented by $X^{21-}$ in Formula (2) is −10 to −3.

(6) The thermoelectric conversion element described in any one of (1) to (5), in which any of the nanocarbon material contained in the p-type thermoelectric conversion layer or the nanocarbon material contained in the n-type thermoelectric conversion layer contains carbon nanotubes.

(7) The thermoelectric conversion element described in any one of (1) to (6), in which any of the nanocarbon material contained in the p-type thermoelectric conversion layer or the nanocarbon material contained in the n-type thermoelectric conversion layer contains single-layer carbon nanotubes.

(8) The thermoelectric conversion element described in any one of (1) to (7), in which the difference between the ionization potential of the p-type thermoelectric conversion layer and the ionization potential of the n-type thermoelectric conversion layer is equal to or smaller than 0.10 eV.

(9) The thermoelectric conversion element described in any one of (1) to (8), in which the difference between the ionization potential of the p-type thermoelectric conversion layer and the ionization potential of the n-type thermoelectric conversion layer is 0.04 to 0.10 eV.

According to the present invention, it is possible to provide a thermoelectric conversion element which includes a p-type thermoelectric conversion layer and an n-type thermoelectric conversion layer, has excellent power generation capacity and durability, and inhibits a variation in power generation capacity between lots.

DESCRIPTION OF THE PREFERRED EMBODIMENTS

Hereinafter, suitable aspects of the thermoelectric conversion element of the embodiment of the present invention will be described. In the present specification, a range of numerical values described using "to" means a range which includes the numerical values listed before and after "to" as a lower limit and an upper limit.

One of the features of the thermoelectric conversion element of the embodiment of the present invention is, for example, that a difference between an ionization potential (Fermi level) of the p-type thermoelectric conversion layer and an ionization potential (Fermi level) of the n-type thermoelectric conversion layer is adjusted. In a nanocarbon material, carbon nanotubes are generally a mixture of semiconductive CNT and metallic CNT and exhibit the properties of a semimetal. Accordingly, in the present invention, the ionization potential is used as terms having the same definition as the Fermi level. Particularly, as will be specifically described later, the inventors of the present invention have found that by using a predetermined onium salt or inorganic salt, the difference in the ionization potential can be easily adjusted.

Figure 1:
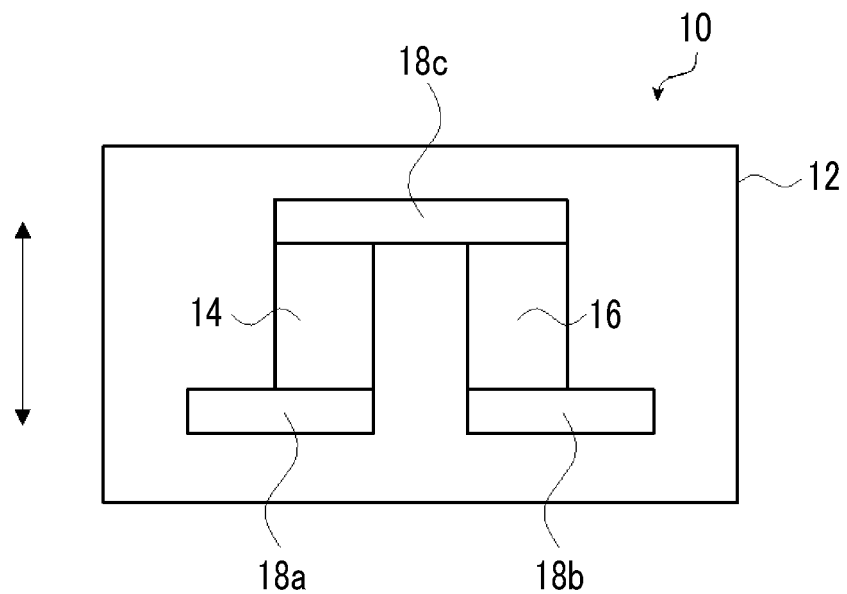
FIG. 1 is a top view schematically showing an embodiment of a thermoelectric conversion element of the present invention. The arrow in FIG. 1 shows the direction of a temperature difference caused at the time of using the element.

FIG. 1 conceptually shows an embodiment of the thermoelectric conversion element of the present invention.

FIG. 1 is a top view of a thermoelectric conversion element 10. The thermoelectric conversion element 10 has a substrate 12 and a p-type thermoelectric conversion layer 14 and an n-type thermoelectric conversion layer 16 disposed in positions spaced apart from each other on the substrate 12. One end portion of the p-type thermoelectric conversion layer 14 is electrically and mechanically connected to a first electrode 18a, and one end portion of the n-type thermoelectric conversion layer 16 is electrically and mechanically connected to a second electrode 18b. Furthermore, the other end portion of the p-type thermoelectric conversion layer 14 and the other end portion of the n-type thermoelectric conversion layer 16 are electrically and mechanically connected to a third electrode 18c. In this way, the p-type thermoelectric conversion layer 14 and the n-type thermoelectric conversion layer 16 are connected to each other in series through the first electrode 18a, the second electrode 18b, and the third electrode 18c. That is, the p-type thermoelectric conversion layer 14 and the n-type thermoelectric conversion layer 16 are electrically connected to each other through the third electrode 18c.

The thermoelectric conversion element 10 makes a temperature difference (in the direction of the arrow in FIG. 1) between the first electrode 18a (or the second electrode 18b) and the third electrode 18c. As a result, for example, the third electrode 18c side becomes a low-temperature portion, and the first electrode 18a and the second electrode 18b sides become high-temperature portions. In a case where such a temperature difference is made, in the interior of the p-type thermoelectric conversion layer 14, a hole carrying a positive charge moves to the low-temperature portion side, and the potential of the third electrode 18c becomes higher than that of the first electrode 18a. In contrast, in the interior of the n-type thermoelectric conversion layer 16, an electron carrying a negative charge moves to the low-temperature portion side, and the potential of the third electrode 18c becomes higher than that of the second electrode 18b. Consequently, a potential difference occurs between the electrodes, and for example, in a case where a load is connected to the end of the electrodes, electric power can be extracted.

In the thermoelectric conversion element of the embodiment of the present invention, a difference between an ionization potential of the p-type thermoelectric conversion layer and an ionization potential of the n-type thermoelectric conversion layer is equal to or smaller than 0.15 eV. Particularly, in view of further improving power generation capacity and durability or further inhibiting the variation in power generation capacity between lots (hereinafter, simply described as "in view of further improving the effects of the present invention" as well), the difference is preferably equal to or smaller than 0.10 eV, more preferably 0.03 to 0.10 eV, and even more preferably 0.04 to 0.10 eV.

The difference in the ionization potential (Ip) is calculated according to the following formula by measuring the ionization potential (Fermi level) of each of the p-type thermoelectric conversion layer and the n-type thermoelectric conversion layer.

Difference in Ip=(Ip of p-type thermoelectric conversion layer)−(Ip of n-type thermoelectric conversion layer)

The ionization potential is measured in the atmosphere by a method of using an atmospheric photoelectron spectrometer (AC-2, manufactured by RIKEN KEIKI Co., Ltd.). More specifically, in a graph (ordinate: eV, abscissa: amount of light) obtained under the condition of the apparatus of amount of light of 20 nW, a measurement interval of 0.05 eV, a measurement range of 4 to 5.5 eV, and a power of 0.5, a point of intersection between a flat portion (baseline) and a regression line was adopted as the ionization potential (threshold of photoelectron emission).

Hereinafter, each of the members constituting the thermoelectric conversion element will be specifically described.

[p-Type Thermoelectric Conversion Layer]

The p-type thermoelectric conversion layer contains a nanocarbon material and at least one kind of component selected from the group consisting of an onium salt and an inorganic salt.

Hereinafter, the materials contained in the p-type thermoelectric conversion layer will be specifically described first, and then the manufacturing method of the p-type thermoelectric conversion layer will be described.

(Nanocarbon Material)

The type of the nanocarbon material is not particularly limited, and known nanocarbon materials can be used.

The size of the nanocarbon material is not particularly limited as long as it is nanosize (less than 1 μm). For example, for carbon nanotubes, carbon nanofiber, or the like which will be described later, the average minor axis thereof may be nanosize (for example, the average minor axis may be equal to or shorter than 500 nm). Furthermore, it is possible to use so-called Buckypaper which is a thin film formed of carbon nanotubes bonded to each other.

Examples of the nanocarbon material include carbon nanotubes, carbon nanobuds, carbon nanohorns, carbon nanofiber, graphite, graphene, carbon nanoparticles, and the like. One kind of these may be used singly, or two or more kinds of these may be used in combination. Among these, carbon nanotubes are preferable because they further improve the thermoelectric conversion performance.

Hereinafter, carbon nanotubes suitable in the present invention will be described.

As the carbon nanotubes (CNT), for example, there are single-layer CNT formed of one sheet of carbon film (graphene sheet) wound in the form of a cylinder, double-layered CNT formed of two graphene sheets wound in the form of concentric circles, and multilayered CNT formed of a plurality of graphene sheets wound in the form of concentric circles. Among these, the single-layer CNT having excellent properties in terms of semiconductor characteristics or the double-layered CNT is preferably used, and the single-layer CNT is more preferably used. In the present invention, one kind of each of the single-layer CNT, double-layered CNT, and multilayered CNT may be used singly, or two or more kinds thereof may be used in combination.

The single-layer CNT may be semiconductive or metallic, and both of semiconductive CNT and metallic CNT may be used in combination. Furthermore, CNT may contain a metal or the like, and CNT containing a fullerene molecule and the like (particularly, CNT containing fullerene is called pivot) may also be used.

CNT can be manufactured by an arc discharge method, a chemical vapor deposition (CVD) method, a laser ablation method, and the like. CNT used in the present invention may be obtained by any method, but it is preferable to use CNT obtained by the arc discharge method or the CVD method.

At the time of manufacturing CNT, fullerene, graphite, and/or amorphous carbon are also generated as by-products in some cases. In order to remove these by-products, CNT may be purified. The CNT purification method is not particularly limited, and examples thereof include methods such as washing, centrifugation, calcination, filtration, oxidation, and chromatography. In addition, an acid treatment using nitric acid, sulfuric acid, or the like and an ultrasonic treatment are also effective for removing the impurities. Furthermore, from the viewpoint of improving purity, it is more preferable to separate and remove the impurities by using a filter.

CNT obtained after purification can be used as it is. Generally, CNT is generated in the form of strings. Therefore, CNT may be used after being cut in a desired length according to the use. By an acid treatment using nitric acid, sulfuric acid, or the like, an ultrasonic treatment, a freezing and pulverizing method, and the like, CNT can be cut in the form of shorter fiber. From the viewpoint of improving purity, it is also preferable to collectively separate CNT by using a filter.

In the present invention, not only cut CNT but also CNT prepared in the form of short fiber can also be used.

The average length of CNT is not particularly limited. From the viewpoint of ease of manufacturing, film formability, conductivity, and the like, the average length is preferably 0.01 to 1,000 μm, and more preferably 0.1 to 100 μm.

The diameter of the single-layer CNT is not particularly limited. From the viewpoint of durability, film formability, conductivity, thermoelectric performance, and the like, the diameter of the single-layer CNT is preferably 0.5 nm to 4.0 nm, more preferably 0.6 nm to 3.0 nm, and even more preferably 0.7 nm to 2.0 nm.

In some cases, the used CNT includes defective CNT. The defect of CNT results in the deterioration of the conductivity and the thermoelectromotive force of the thermoelectric conversion layer. Therefore, it is preferable to reduce the defect. The amount of the defect of CNT can be estimated by an intensity ratio G/D (hereinafter, referred to as G/D ratio) between a G-band and a D-band in a Raman spectrum. In a case where the G/D ratio is high, the CNT material can be estimated as having a small amount of defects. Particularly, in a case where single-layer CNT is used, the G/D ratio is preferably equal to or higher than 10, and more preferably equal to or higher than 30.

In view of thermoelectric conversion performance, the content of the nanocarbon material in the p-type thermoelectric conversion layer with respect to the total solid contents in the p-type thermoelectric conversion layer is preferably 5% to 99.9% by mass, more preferably 20% to 99.9% by mass, even more preferably 40% to 99.9% by mass, and particularly preferably 60% to 99.9% by mass.

The solid contents mean components forming the thermoelectric conversion layer and do not include a solvent.

(Onium Salt and Inorganic Salt)

The p-type thermoelectric conversion layer contains at least one kind of component selected from the group consisting of an onium salt and an inorganic salt.

As the onium salt, known onium salts can be used as long as the difference between the ionization potential of the p-type thermoelectric conversion layer and the ionization potential of the n-type thermoelectric conversion layer falls into the range described above.

Particularly, in view of further improving the effects of the present invention, at least one kind of onium salt selected from the group consisting of an onium salt represented by Formula (1A) to an onium salt represented by Formula (1D) or a polymer having a residue obtained by removing one hydrogen atom from one kind of onium salt selected from the group consisting of the onium salt represented by Formula (1A) to the onium salt represented by Formula (1D) is preferable.

Hereinafter, the onium salts will be specifically described.

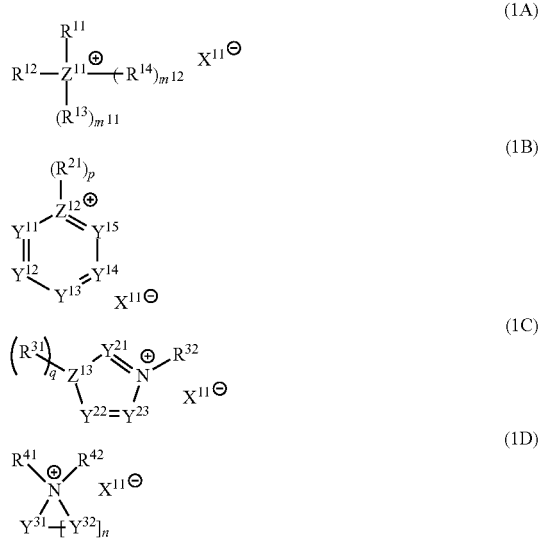

In Formula (1A), $Z^{11}$ represents a nitrogen atom, a phosphorus atom, a sulfur atom, an oxygen atom, a carbon atom, or a halogen atom. Among these, in view of further improving the effects of the present invention, a nitrogen atom is preferable.

In a case where $Z^{11}$ is a nitrogen atom or a phosphorus atom, both of $m^{11}$ and $m^{12}$ are 1. In a case where $Z^{11}$ is a sulfur atom, an oxygen atom, or a carbon atom, $m^{11}$ is 1, and $m^{12}$ is 0. In a case where $Z^{11}$ is a halogen atom, both of $m^{11}$ and $m^{12}$ are 0.

$X^{11-}$ represents an anion whose conjugate acid has a pKa equal to or lower than −3.

Examples of $X^{11-}$ include $Cl^-$, $Br^-$, $I^-$, $NO_3^-$, $HSO_4^-$, an anion of alkylsulfonic acid (for example, $CH_3SO_3^-$), an anion of arylsulfonic acid (for example, $p\text{-}CH_3C_6H_4SO_3^-$ and $PhSO_3^-$), an anion of perfluoroalkanesulfonic acid (for example, $CF_3SO_3^-$, $C_4F_9SO_3^-$, and $C_8F_{17}SO_3^-$), an anion of perhalogenated Lewis acid (for example, $PF_6^-$, $SbF_6^-$, $BF_4^-$, $AsF_6^-$, and $FeCl_4^-$), an anion of perfluoroalkanesulfonimide (for example, $(CF_3SO_2)_2N^-$, $(C_4F_9SO_2)_2N^-$, and $(FSO_2)_2N^-$), an anion of perhalogenic acid (for example, $ClO_4^-$, $BrO_4^-$, and $IO_4^-$), an anion of alkyl- or aryl borate (for example, $(C_6H_5)_4B^-$, $(C_6F_5)_4B^-$, $(p\text{-}CH_3C_6H_4)_4B^-$, and $(p\text{-}C_6H_4F)_4B^-$), and the like. These may further have a substituent, and examples of the substituent include a fluorine atom.

Among these, in view of further improving the effects of the present invention, as $X^{11-}$, $Cl^-$, $Br^-$, $I^-$, $HSO_4^-$, $PF_6^-$, $BF_4^-$, $(CF_3SO_2)_2N^-$, $(C_4F_9SO_2)_2N^-$, $(FSO_2)_2N^-$, $ClO_4^-$, or $(C_6F_5)_4B^-$ is preferable.

For pKa, the values (in water) described in "Handbook of Chemistry, 5$^{th}$ revised edition, The Chemical Society of Japan" can be referred to. More specifically, pKa in "anion whose conjugate acid has a pKa equal to or lower than −3" is based on the value of pKa of sulfuric acid, which is a conjugate acid of a hydrogen sulfate ion, in water. For the conjugate acid of an anion which is not described in "Handbook of Chemistry, 5$^{th}$ revised edition, The Chemical Society of Japan", the value of pKa can be calculated by dissolving the conjugate acid of the onium salt (or the inorganic salt which will be described later) in water and titrating the solution by using an aqueous sodium hydroxide solution. For an acid which is a conjugate acid of an anion not being described in "Handbook of Chemistry, 5$^{th}$ revised edition, The Chemical Society of Japan" and is stronger than an oxonium ion ($H_3O^+$, pKa=−1.7), it is difficult to measure the value of pKa by the above method. Therefore, the value of pKa can be calculated according to the method for measuring acidity function described in "New Edition of Experimental Chemistry Course, 3$^{rd}$ edition, The Chemical Society of Japan."

$R^{11}$ to $R^{14}$ each independently represent a hydrogen atom or an organic group selected from the group consisting of a hydrocarbon group which may contain a heteroatom, a heterocyclic group, and a group which is obtained by combining two or more of these groups.

The number of carbon atoms contained in the organic group is not particularly limited, but is generally about 1 to 30 for example. In view of further improving the effects of the present invention, the number of carbon atoms is preferably 1 to 20, and more preferably 1 to 7.

The number of carbon atoms contained in the hydrocarbon group is not particularly limited, but is generally about 1 to 30 for example. In view of further improving the effects of the present invention, the number of carbon atoms is preferably 1 to 20, and more preferably 1 to 7.

The hydrocarbon group may be any of a linear, branched, or cyclic hydrocarbon group.

Specific examples of the hydrocarbon group include an alkyl group, an alkenyl group, an alkynyl group, an aralkyl group, an aryl group, and a group obtained by combining two or more of these groups.

The hydrocarbon group may contain a heteroatom. The type of the heteroatom is not particularly limited, and examples thereof include an oxygen atom, a nitrogen atom, a sulfur atom, a selenium atom, a tellurium atom, and the like. It is preferable that the heteroatom is incorporated in the form of $-Y^1-$, $-N(Ra)-$, $-C(=Y^2)-$, $-CON(Rb)-$, $-C(=Y^3)Y^4-$, $-SOt-$, $-SO_2N(Rc)-$, or a group obtained by combining these, among the above.

$Y^1$ to $Y^4$ is each independently represents an oxygen atom, a sulfur atom, a selenium atom, or a tellurium atom. t represents an integer of 1 to 3. Ra, Rb, and Rc each independently represent a hydrogen atom or an alkyl group.

As the heterocyclic group, for example, a heterocyclic group having 3 to 12 carbon atoms (preferably 3 to 7 carbon atoms) is preferable. Examples thereof include a furyl group, a thiofuryl group, a pyridyl group, a pyrazole group, an imidazolyl group, a benzimidazolyl group, an indolyl group, a quinolyl group, an isoquinolyl group, a purine group, a pyrimidyl group, a pirazyl group, an oxazolyl group, a thiazolyl group, a triazyl group, a carbazolyl group, a quinoxalyl group, a thiazine group, and the like.

The aforementioned organic group may be substituted with a substituent. The type of the substituent is not particularly limited. Examples of the substituent include an alkyl group such as a methyl group or an ethyl group, an aryl group such as a phenyl group or a naphthyl group, a hydroxyl group, an amino group, a carboxyl group, an amide group (a group represented by $R_X$—C(=O)$NR_Y$— or $R_X$—$NR_Y$C(=O)—, $R_X$ represents a monovalent organic group and $R_Y$ represents a hydrogen atom or an alkyl group), a urethane group (a group represented by $R_X$—NHC(=O)O— or $R_X$—OC(=O)NH—, $R_X$ represents a monovalent organic group), a sulfonamide group, a N-sulfonylamide group, an acyl group, an acyloxy group such as an acetoxy group, an alkoxy group such as a methoxy group or an ethoxy group, a halogen atom such as a fluorine atom, a chlorine atom, a bromine atom, or an iodine atom, an alkoxycarbonyl group such as a methoxycarbonyl group, an ethoxycarbonyl group, or a cyclohexyloxycarbonyl group, a carbonic acid ester group such as t-butyl carbonate, a cyano group, and the like.

Here, in a case where $Z^{11}$ is a nitrogen atom, a phosphorus atom, a sulfur atom, an oxygen atom, or a carbon atom, and the pKa of the conjugate acid of the anion represented by $X^{11-}$ is −10 to −3, at least three groups among $R^{11}$ to $R^{14}$ are a hydrogen atom or an organic group having 7 or less carbon atoms. Particularly, it is preferable that at least two groups among $R^{11}$ to $R^{14}$ are a hydrogen atom, and it is more preferable that at least three groups among $R^{11}$ to $R^{14}$ are a hydrogen atom (particularly, in a case where the anion is Cl−, the present aspect is preferable).

The organic group having 7 or less carbon atoms means an organic group which is selected from the group consisting of a hydrocarbon group which may contain a heteroatom, a heterocyclic group, and a group obtained by combining two or more of these groups and contains 7 or less carbon atoms. The organic group having 7 or less carbon atoms is preferably an organic group having 6 or less carbon atoms, more preferably an organic group having 4 or less carbon atoms, and even more preferably an organic group having 2 or less carbon atoms.

Here, in a case where $Z^{11}$ is a halogen atom, and the pKa of the conjugate acid of the anion represented by $X^{11-}$ is −10 to −3, $R^{11}$ and $R^{12}$ are an organic group having 7 or less carbon atoms.

In Formula (1B), $Z^{12}$ represents a nitrogen atom or an oxygen atom.

In a case where $Z^{12}$ is a nitrogen atom, p is 1. In a case where $Z^{12}$ is an oxygen atom, p is 0.

$X^{11-}$ represents an anion whose conjugate acid has a pKa equal to or lower than −3. Examples and a suitable range of the anion are as described above.

$R^{21}$ represents a hydrogen atom or an organic group selected from the group consisting of a hydrocarbon group which may contain a heteroatom, a heterocyclic group, and a group obtained by combining two or more of these groups. The definition and examples of each of the hydrocarbon group which may have a heteroatom, the heterocyclic group, and the organic group are the same as the definition and examples described above regarding $R^{11}$ to $R^{14}$.

$Y^{11}$ to $Y^{15}$ each independently represent a nitrogen atom or =$CR^{61}$—.

In a case where a plurality of groups among $Y^{11}$ to $Y^{15}$ represents =$CR^{61}$— $R^{61}$'s, substituting adjacent carbon atoms may form an aromatic or non-aromatic ring by being linked to each other.

$R^{61}$ represents a hydrogen atom, an aliphatic hydrocarbon group, a halogen atom, a cyano group, a nitro group, an alkoxycarbonyl group, an acyl group, an alkoxy group, a carboxyl group, an alkylthio group, an acyloxy group, a formyl group, a thioester group, an amide group, a sulfonamide group, a hydroxyl group, a thiol group, an aralkyl group, an aryl group, or a heterocyclic group.

Examples of the aliphatic hydrocarbon group include an alkyl group (preferably having 1 to 20 carbon atoms, more preferably having 1 to 10 carbon atoms, and even more preferably having 1 to 7 carbon atoms), an alkenyl group (preferably having 2 to 20 carbon atoms, more preferably having 2 to 10 carbon atoms, and even more preferably having 2 to 7 carbon atoms), and an alkynyl group (preferably having 2 to 20 carbon atoms, more preferably having 2 to 10 carbon atoms, and even more preferably having 2 to 7 carbon atoms). Among these, an alkyl group is preferable.

The aliphatic hydrocarbon group may be any of a linear, branched, or cyclic aliphatic hydrocarbon group, but is more preferably a linear aliphatic hydrocarbon group.

The aliphatic hydrocarbon group may contain a heteroatom.

As the alkoxycarbonyl group, an alkoxycarbonyl group having 2 to 7 carbon atoms (preferably having 2 to 6 carbon atoms) is preferable. Examples thereof include a methoxycarbonyl group and an ethoxycarbonyl group.

As the acyl group, an acyl group having 2 to 7 carbon atoms (preferably having 2 to 6 carbon atoms) is preferable. Examples thereof include an acetyl group.

As the alkoxy group, an alkoxy group having 1 to 7 carbon atoms (preferably having 1 to 6 carbon atoms) is preferable. Examples thereof include a methoxy group, an ethoxy group, and the like.

As the alkylthio group, an alkylthio group having 1 to 7 carbon atoms (preferably having 1 to 6 carbon atoms) is preferable. Examples thereof include a methylthio group and an ethylthio group.

As the acyloxy group, an acyloxy group having 1 to 7 carbon atoms (preferably having 1 to 6 carbon atoms) is preferable. Examples thereof include an acetoxy group.

As the thioester group, a thioester group having 2 to 7 carbon atoms (preferably having 2 to 6 carbon atoms) is preferable. The thioester group may be a group represented by $R_X$—C(=O)—S— or a group represented by $R_X$—S—C(=O)—. Examples of $R_X$ include a monovalent organic group (for example, an alkyl group).

As the amide group, an amide group having 2 to 7 carbon atoms (preferably having 2 to 6 carbon atoms) is preferable. The amide group may be a group represented by $R_Y$—C(=O)—$NR_Z$— or a group represented by $R_Y$—$NR_Z$—C(=O)—. Examples of $R_Y$ and $R_Z$ include a hydrogen atom or a monovalent organic group (for example, an alkyl group).

As the sulfonamide group, a sulfonamide group having 2 to 10 carbon atoms (preferably having 2 to 6 carbon atoms) is preferable. Examples thereof include an N,N-dimethylaminosulfonyl group. The sulfonamide group may be a group represented by $R_Y$—$NR_Z$—S(=O)$_2$— or a group represented by $R_Y$—S(=O)$_2NR_Z$—. Examples of $R_Y$ and $R_Z$ include a hydrogen atom or a monovalent organic group (for example, an alkyl group).

As the aralkyl group, for example, an aralkyl group having 7 to 15 carbon atoms is preferable. Specifically, examples thereof include a benzyl group, a phenethyl group, a 1-naphthylmethyl group, a 1-(1-naphthyl)ethyl group, a triphenylmethyl group, and a pyrenylmethyl group.

As the aryl group, an aryl group having 6 to 20 carbon atoms is preferable. Examples thereof include a phenyl group, a naphthyl group, an anthranyl group, a phenacyl group, and a pyrenyl group.

The heterocyclic group has the same definition as the heterocyclic group represented by $R^{11}$ to $R^{14}$.

Here, in a case where the pKa of the conjugate acid of the anion represented by $X^{11-}$ is −10 to −3, $R^{21}$ is a hydrogen atom or an organic group having 7 or less carbon atoms. $R^{21}$ is preferably a hydrogen atom or an organic group having 4 or less carbon atoms, more preferably a hydrogen atom or an organic group having 2 or less carbon atoms, and even more preferably a hydrogen atom.

In Formula (1C), $Z^{13}$ represents a nitrogen atom, an oxygen atom, or a sulfur atom.

In a case where $Z^{13}$ is a nitrogen atom, q is 1. In a case where $Z^{13}$ is an oxygen atom or a sulfur atom, q is 0.

$X^{11-}$ represents an anion whose conjugate acid has a pKa equal to or lower than −3. Examples and a suitable range of the anion are as described above.

$R^{31}$ and $R^{32}$ each independently represent a hydrogen atom or an organic group selected from the group consisting of a hydrocarbon group which may contain a heteroatom, a heterocyclic group, and a group obtained by combining two or more of these groups. The definition and examples of each of the hydrocarbon group which may contain a heteroatom, the heterocyclic group, and the organic group are the same as the definition and examples described above regarding $R^{11}$ to $R^{14}$.

$Y^{21}$ to $Y^{23}$ each independently represent a nitrogen atom or $=CR^{61}-$. $R^{61}$ represents a hydrogen atom, an aliphatic hydrocarbon group, a halogen atom, a cyano group, a nitro group, an alkoxycarbonyl group, an acyl group, an alkoxy group, an alkylthio group, an acyloxy group, a formyl group, a thioester group, an amide group, a sulfonamide group, a hydroxyl group, a carboxyl group, a thiol group, an aralkyl group, an aryl group, or a heterocyclic group. The definition of each group represented by $R^{61}$ is as described above.

Here, in a case where the pKa of the conjugate acid of the anion represented by $X^{11-}$ is −10 to −3, $R^{31}$ and $R^{32}$ are a hydrogen atom or an organic group having 7 or less carbon atoms. $R^{31}$ and $R^{32}$ are preferably a hydrogen atom or an organic group having 4 or less carbon atoms, more preferably a hydrogen atom or an organic group having 2 or less carbon atoms, and even more preferably a hydrogen atom.

In Formula (1D), $X^{11-}$ represents an anion whose conjugate acid has a pKa equal to or lower than −3. Examples of the anion are as described above. In view of further improving the effects of the present invention, $X^{11-}$ is preferably $Cl^-$, $Br^-$, $I^-$, $HSO_4^-$, $PF_6^-$, $BF_4^-$, $(CF_3SO_2)_2N^-$, $(C_4F_9SO_2)_2N^-$, $(FSO_2)_2N^-$, $ClO_4^-$, or $(C_6F_5)_4B^-$, and more preferably $PF_6^-$, $BF_4^-$, $(CF_3SO_2)_2N^-$, $(C_4F_9SO_2)_2N^-$, or $(FSO_2)_2N^-$.

$R^{41}$ and $R^{42}$ each independently represent a hydrogen atom or an organic group selected from the group consisting of a hydrocarbon group which may contain a heteroatom, a heterocyclic group, and a group obtained by combining two or more of these groups. The definition and examples of each of the hydrocarbon group which may contain a heteroatom, the heterocyclic group, and the organic group are the same as the definition and examples described above regarding $R^{11}$ to $R^{14}$.

$Y^{31}$ and $Y^{32}$ each independently represent $-C(R^{62})_2-$, $-NR^{63}-$, $-O-$, $-C(=O)-$, $-CO_2-$, $-S-$, $-SO-$, or $SO_2$. $R^{62}$ represents a hydrogen atom, an aliphatic hydrocarbon group, a halogen atom, an aralkyl group, an aryl group, or a heterocyclic group. $R^{63}$ represents a hydrogen atom, an aliphatic hydrocarbon group, an aralkyl group, an aryl group, or a heterocyclic group.

The suitable range of each group represented by $R^{62}$ and $R^{63}$ is the same as the suitable range of each group represented by $R^{61}$.

n represents an integer of 1 to 18. n is preferably an integer of 3 to 10, more preferably 3 or 4, and even more preferably 3.

$R^{62}$ and $R^{63}$ may further have a substituent. In a case where $Y^{31}$ or $Y^{32}$ represents $-C(R^{62})_2-$ or $-NR^{63}-$, the group represented by $R^{41}$ or $R^{42}$ may form an aromatic or non-aromatic ring by being linked to $R^{62}$ or $R^{63}$.

Here, in a case where the pKa of the conjugate acid of the anion represented by $X^{11-}$ is −10 to −3, $R^{41}$ and $R^{42}$ are a hydrogen atom or an organic group having 7 or less carbon atoms. $R^{41}$ and $R^{42}$ are preferably a hydrogen atom or an organic group having 4 or less carbon atoms, more preferably a hydrogen atom or an organic group having 2 or less carbon atoms, and even more preferably a hydrogen atom.

Examples of another aspect of the onium salt include a polymer having a residue obtained by removing one hydrogen atom from one kind of onium salt selected from the group consisting of the onium salt represented by Formula (1A) to the onium salt represented by Formula (1D).

The residue refers to a group which is obtained by withdrawing one hydrogen atom from any position in one kind of onium salt selected from the group consisting of the onium salt represented by Formula (1A) to the onium salt represented by Formula (1D) and has a structure capable of making a bond at the position from which the hydrogen atom is withdrawn.

Examples of suitable aspects of the polymer include a polymer having a repeating unit represented by Formula (3).

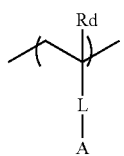

(3)

In Formula (3), Rd represents a hydrogen atom or an alkyl group.

In Formula (3), L represents a single bond or a divalent linking group. The divalent linking group is not particularly limited, and examples thereof include a divalent hydrocarbon group (the divalent hydrocarbon group may be a divalent saturated hydrocarbon group or a divalent aromatic hydrocarbon group; the divalent saturated hydrocarbon group may be linear, branched, or cyclic and preferably has 1 to 20 carbon atoms; examples of the divalent saturated hydrocarbon group include an alkylene group; the divalent aromatic hydrocarbon group preferably has 5 to 20 carbon atoms; examples of the divalent aromatic hydrocarbon group include a phenylene group; in addition, the divalent hydrocarbon group may be an alkenylene group or an alkynylene group), a divalent heterocyclic group, $-O-$, $-S-$, $-SO_2-$, $-NR_L-$, $-C(=O)-$, $-C(=O)O-$, $-C(=O)NR_L-$, $-SO_3-$, $-SO_2NR_L-$, a group obtained by combining two or more of these groups (for example, an alkyleneoxy group, an alkyleneoxycarbonyl group, or an alkylenecarbonyloxy group), and the like. $R_L$ represents a hydrogen atom or an alkyl group (preferably having 1 to 10 carbon atoms).

In Formula (3), A represents a residue obtained by removing one hydrogen atom from at least one kind of onium salt selected from the group consisting of the onium salt represented by Formula (1A) to the onium salt represented by Formula (1D).

As the inorganic salt, as long as the difference between the ionization potential of the p-type thermoelectric conversion layer and the ionization potential of the n-type thermoelectric conversion layer falls into the range described above, known inorganic salts can be used.

Metal atoms contained in the inorganic salt are not particularly limited, and examples thereof include an alkali metal atom, an alkaline earth metal atom, and a transition metal atom.

Examples of the alkali metal atom include a lithium atom, a sodium atom, a potassium atom, a rubidium atom, and a cesium atom.

Examples of the alkaline earth metal atom include a beryllium atom, a magnesium atom, a calcium atom, a strontium atom, and a barium atom.

Examples of the transition metal atom include a zinc atom, a titanium atom, a vanadium atom, a chromium atom, a manganese atom, an iron atom, a cobalt atom, a nickel atom, a copper atom, a yttrium atom, a zirconium atom, a niobium atom, a molybdenum atom, a technetium atom, a ruthenium atom, a rhodium atom, a palladium atom, a silver atom, a cadmium atom, a lanthanum atom, a cerium atom, a praseodymium atom, a neodymium atom, a promethium atom, a samarium atom, an europium atom, a gadolinium atom, a terbium atom, a dysprosium atom, a holmium atom, an erbium atom, a thulium atom, a ytterbium atom, a lutetium atom, a hafnium atom, a tantalum atom, a tungsten atom, a rhenium atom, an osmium atom, an iridium atom, a platinum atom, a gold atom, and a mercury atom.

The pKa of the conjugate acid of the anion in the inorganic salt is not particularly limited. However, in view of further improving the effects of the present invention, the pKa is preferably equal to or lower than −3.

In a case where the metal atom is a transition metal atom, it is preferable that the anion in the inorganic salt is an anion other than an anion of a halide whose conjugate acid has a pKa equal to or lower than −3.

Specific examples of the anion in the inorganic salt include $F^-$, $Cl^-$, $Br^-$, $I^-$, $NO_3^-$, $HSO_4^-$, an anion of alkylsulfonic acid (for example, $CH_3SO_3^-$), an anion of arylsulfonic acid (for example, $p-CH_3C_6H_4SO_3^-$ and $PhSO_3^-$), an anion of perfluoroalkylsulfonic acid (for example, $CF_3SO_3^-$, $C_4F_9SO_3^-$, and $C_8F_{17}SO_3^-$), an anion of perhalogenated Lewis acid (for example, $PF_6^-$, $SbF_6^-$, $BF_4^-$, $AsF_6^-$, and $FeCl_4^-$), an anion of perfluoroalkylsulfonimide (for example, $(CF_3SO_2)_2N^-$, $(C_4F_9SO_2)_2N^-$, and $(FSO_2)_2N^-$), an anion of perhalogenic acid (for example, $ClO_4^-$, $BrO_4^-$, and $IO_4^-$), an anion of alkyl- or aryl borate (for example, $(C_6H_5)_4B^-$, $(C_6F_5)_4B^-$, $(p-CH_3C_6H_4)_4B^-$, and $(p-C_6H_4F)_4B^-$), and the like. These may further have a substituent, and examples of the substituent include a fluorine atom.

In a case where the metal atom is an alkali metal atom or an alkaline earth metal atom, in view of further improving the effects of the present invention, the anion is preferably $Cl^-$, $Br^-$, $I^-$, an anion of perhalogenated Lewis acid, or an anion of perfluoroalkylsulfonimide, and more preferably $Cl^-$, $Br^-$, or an anion of perfluoroalkylsulfonimide.

In a case where the metal atom is a transition metal atom, in view of further improving the effects of the present invention, the anion is preferably an anion of perhalogenated Lewis acid, an anion of perfluoroalkylsulfonimide, an anion of perhalogenic acid, or an anion of alkyl- or aryl borate, and more preferably an anion of perfluoroalkylsulfonimide.

From the viewpoint of thermoelectric conversion performance, the total content of the onium salt and the inorganic salt in the p-type thermoelectric conversion layer with respect to the total mass of the nanocarbon material in the thermoelectric conversion layer is preferably 0.01% to 20% by mass, more preferably 0.05% to 10% by mass, and even more preferably 0.1% to 5% by mass.

Only one kind of onium salt may be used singly, or two or more kinds of onium salts may be used in combination.

Furthermore, only one kind of inorganic salt may be used singly, or two or more kinds of inorganic salts may be used in combination.

From the viewpoint of causing a temperature difference and the like, the average thickness of the p-type thermoelectric conversion layer is preferably 1 to 500 µm, more preferably 5 to 500 µm, and even more preferably 10 to 500 µm.

The average thickness of the p-type thermoelectric conversion layer is determined by measuring thicknesses of the p-type thermoelectric conversion layer at 10 random points and calculating the arithmetic mean thereof.

(Optional Components)

The p-type thermoelectric conversion layer may contain components (a polymer compound, a surfactant, an antioxidant, a thickener, an antifoaming agent, and the like) other than the nanocarbon material and at least one kind of component selected from the group consisting of an onium salt and an inorganic salt described above.

(Manufacturing Method of p-Type Thermoelectric Conversion Layer)

The method for manufacturing the p-type thermoelectric conversion layer is not particularly limited, and examples thereof include the following two methods.

(First method) A method of using a composition for forming a p-type thermoelectric conversion layer containing a nanocarbon material and at least one kind of component selected from the group consisting of an onium salt and an inorganic salt (Second method) A method of preparing a thermoelectric conversion layer precursor by using a composition for forming a thermoelectric conversion layer precursor containing a nanocarbon material and then forming a p-type thermoelectric conversion layer by applying at least one kind of component selected from the group consisting of an onium salt and an inorganic salt to the thermoelectric conversion layer precursor Hereinafter, the procedure of each of (First method) and (Second method) will be specifically described.

(First Method)

The composition for forming a p-type thermoelectric conversion layer used in the first method contains a nanocarbon material and at least one kind of component selected from the group consisting of an onium salt and an inorganic salt.

The definition of each of the components is as described above.

It is preferable that the composition for forming a p-type thermoelectric conversion layer contains a solvent.

The dispersion medium (solvent) is not limited as long as it can disperse the nanocarbon material, and water, an organic solvent, and a mixed solvent of these can be used. Examples of the organic solvent include an alcohol-based solvent (for example, methanol, ethanol, propanol, butanol, methyl carbitol, butyl carbitol, 1-methoxy-2-propanol, ethylene glycol, propylene glycol, glycerin, or the like), a halogen-based solvent (for example, chloroform, dichloromethane, 1,2-dichloroethane, or the like), an aprotic polar solvent (for example, dimethylformamide (DMF), dimethylacetamide (DMAc), N-methylpyrrolidone (NMP), N-ethylpyrrolidone (NEP), dimethylsulfoxide (DMSO), or the like), an aromatic solvent (for example, chlorobenzene, dichlorobenzene, benzene, toluene, xylene, mesitylene, tetralin, tetramethylbenzene, pyridine, or the like), a ketone-based solvent (for example, cyclohexanone, acetone, methyl ethyl ketone, isophorone, or the like), an ether-based solvent (for example, diethyl ether, tetrahydrofuran (THF), 1,4-dioxane, t-butyl methyl ether, cyclopentyl methyl ether, dimethoxyethane, diglyme, or the like), and an ester-based solvent (for example, ethyl acetate, butyl acetate, propylene glycol 1-monomethyl ether 2-acetate, or the like).

In addition to the aforementioned components, the composition for forming a p-type thermoelectric conversion layer may contain a polymer compound (binder), a surfactant, an antioxidant, a thickener, or an antifoaming agent.

The composition for forming a p-type thermoelectric conversion layer can be prepared by mixing together the components described above. For example, it is preferable to use a method of mixing the nanocarbon material, the onium salt, and/or the inorganic salt with other components, which are used as desired, in the presence of a solvent.

The mixing method is not particularly limited and can be performed using a general mixing device or the like at room temperature and normal pressure. For example, the composition may be prepared by dissolving or dispersing the components in a solvent by means of stirring, shaking, or kneading. In order to accelerate the dissolution or dispersion, an ultrasonic treatment may be performed.

Furthermore, it is possible to improve the dispersibility of the nanocarbon material by means of heating the solvent to a temperature that is equal to or higher than room temperature and equal to or lower than the boiling point in the aforementioned dispersion step, extending the dispersion time, increasing the intensity of stirring, shaking, kneading, or ultrasonic waves applied, and the like.

The method for manufacturing a p-type thermoelectric conversion layer by using the composition for forming a p-type thermoelectric conversion layer is not particularly limited, and examples thereof include a method for forming a film by coating a substrate with the aforementioned composition.

The film-forming method is not particularly limited, and it is possible to use known coating methods such as a spin coating method, an extrusion die coating method, a blade coating method, a bar coating method, a screen printing method, a stencil printing method, a roll coating method, a curtain coating method, a spray coating method, a dip coating method, and an ink jet method. The film can be formed not only by filtering the composition under reduced pressure or filtering the composition under pressure but by casting the composition into a mold.

If necessary, a drying step is performed after coating. For example, by heating the thermoelectric conversion layer from the substrate side or by blowing hot air to the thermoelectric conversion layer, the solvent can be volatilized and dried. The drying may be performed under reduced pressure or in an inert atmosphere.

In a case where the composition contains a dispersant or a surfactant, it is preferable to additionally perform a step of removing the dispersant or the surfactant after printing. The removal of the dispersant or the surfactant can be performed by a method of washing the thermoelectric conversion layer with a solvent that dissolves the dispersant or the surfactant, and the like.

(Second Method)

The second method is a method of preparing a p-type thermoelectric conversion layer precursor by using a composition for forming a p-type thermoelectric conversion layer precursor containing a nanocarbon material and then forming a p-type thermoelectric conversion layer by applying at least one kind of component selected from the group consisting of an onium salt and an inorganic salt to the p-type thermoelectric conversion layer precursor.

The composition for forming a p-type thermoelectric conversion layer precursor contains a nanocarbon material. The definition of the nanocarbon material is as described above.

It is preferable that the composition for forming a p-type thermoelectric conversion layer precursor contains a solvent in addition to the nanocarbon material. Specific examples of the solvent include solvents which can be contained in the composition for forming a p-type thermoelectric conversion layer.

The composition for forming a p-type thermoelectric conversion layer precursor may further contain other components. Specific examples of those other components are the same as the specific examples listed in the first method described above.

The method for manufacturing the p-type thermoelectric conversion layer precursor by using the composition for forming a p-type thermoelectric conversion layer precursor is not particularly limited, and examples thereof include the film-forming method of the p-type thermoelectric conversion layer of the first method described above.

In the second method, after the p-type thermoelectric conversion layer precursor is prepared, by using at least one kind of component selected from the group consisting of an onium salt and an inorganic salt described above as a dopant, the nanocarbon material is doped to become a p-type The doping method for change to a p-type is not particularly limited, and examples thereof include a method of immersing the p-type thermoelectric conversion layer precursor in a solution (dopant-containing solution) obtained by dissolving at least one kind of component selected from the group consisting of an onium salt and an inorganic salt described above in a solvent. The type of the solvent is not particularly limited, and examples thereof include the solvents which can be contained in the composition for forming a p-type thermoelectric conversion layer described above.

The concentration of the onium salt or the inorganic salt in the dopant-containing solution is preferably 0.01 to 10,000 mmol/L, more preferably 0.1 to 1,000 mmol/L, and even more preferably 1 to 100 mmol/L.

After the doping for change to a p-type, if necessary, a drying step is performed. For example, by heating the thermoelectric conversion layer from the substrate side or by blowing hot air to the thermoelectric conversion layer, the solvent can be volatilized and dried. The drying may be performed under reduced pressure or in an inert atmosphere.

The drying temperature is not particularly limited. However, in view of productivity, the drying temperature is preferably 20° C. to 300° C.

The drying time is not particularly limited. However, in view of productivity, the drying time is preferably 0.5 to 5 hours.

[n-Type Thermoelectric Conversion Layer]

The n-type thermoelectric conversion layer contains a nanocarbon material and an onium salt.

Hereinafter, the materials contained in the n-type thermoelectric conversion layer will be specifically described first, and then the manufacturing method of the n-type thermoelectric conversion layer will be described.

(Nanocarbon Material)

The n-type thermoelectric conversion layer contains a nanocarbon material. The definition of the nanocarbon material is as described above.

In view of thermoelectric conversion performance, the content of the nanocarbon material in the n-type thermoelectric conversion layer with respect to the total solid contents in the n-type thermoelectric conversion layer is preferably 5% to 99.9% by mass, more preferably 20% to 99.9% by mass, even more preferably 40% to 99.9% by mass, and particularly preferably 60% to 99.9% by mass.

Only one kind of nanocarbon material may be used singly, or two or more kinds of nanocarbon materials may be used in combination.

(Onium Salt)

The n-type thermoelectric conversion layer contains an onium salt.

As the onium salt, as long as a difference between an ionization potential of the p-type thermoelectric conversion layer and an ionization potential of the n-type thermoelectric conversion layer falls into the aforementioned range, known onium salts can be used.

Particularly, in view of further improving the effects of the present invention, an onium salt represented by Formula (2) is preferable.

(2)

In Formula (2), $Z^{21}$ represents a nitrogen atom, a phosphorus atom, a sulfur atom, or an oxygen atom. In view of further improving the effects of the present invention, a nitrogen atom is preferable.

In a case where $Z^{21}$ is a nitrogen atom or a phosphorus atom, r is 1. In a case where $Z^{21}$ is a sulfur atom or an oxygen atom, r is 0.

$X^{21-}$ represents an anion whose conjugate acid has a pKa equal to or higher than −10.

In view of further improving the effects of the present invention, the pKa of the conjugate acid of the anion is preferably −10 to −3, and more preferably −7 to −3.7.

Specific examples of the anion include $F^-$, $Cl^-$, $Br^-$, $I^-$, $NO_3^-$, $HSO_4^-$, an anion of alkylsulfonic acid (for example, $CH_3SO_3^-$), an anion of arylsulfonic acid (for example, $p\text{-}CH_3C_6H_4SO_3^-$ and $PhSO_3D$, $OH^-$, an alkoxy ion ($RO^-$), $SH^-$, an alkyl- or arylthio ion ($RS^-$), a cyanide ion ($CN^-$), a carboxy ion ($RCO_2\text{---}$), and the like.

These may further have a substituent, and examples of the substituent include a fluorine atom.

Among these, $F^-$, $Cl^-$, $Br^-$, $I^-$, $NO_3^-$, or $HSO_4^-$ is preferable, and $Cl^-$ or $Br^-$ is more preferable.

$R^{51}$ to $R^{54}$ each independently represent a hydrogen atom or an organic group selected from the group consisting of a hydrocarbon group which may contain a heteroatom, a heterocyclic group, and a group obtained by combining two or more of these groups.

The number of carbon atoms contained in the organic group is not particularly limited, but is generally about 1 to 30 for example. In view of further improving the effects of the present invention, the number of carbon atoms is preferably equal to or greater than 8, and more preferably 8 to 20.

The number of carbon atoms contained in the hydrocarbon group is not particularly limited, but is generally about 1 to 30 for example. In view of further improving the effects of the present invention, the number of carbon atoms is preferably equal to or greater than 8, and more preferably 8 to 20.

The hydrocarbon may be any of a linear, branched, or cyclic hydrocarbon group.

Specific examples of the hydrocarbon group include an alkyl group, an alkenyl group, an alkynyl group, an aralkyl group, an aryl group, and a group obtained by combining two or more of these groups.

The hydrocarbon group may contain a heteroatom. The type of the heteroatom is not particularly limited, and examples thereof include an oxygen atom, a nitrogen atom, a sulfur atom, a selenium atom, a tellurium atom, and the like. It is preferable that the heteroatom is incorporated in the form of —$Y^1$—, —N(Ra)—, —C(=$Y^2$)—, —CON(Rb)—, —C(=$Y^3$)$Y^4$—, —SOt-, —SO$_2$N(Rc)-, or a group obtained by combining these, among the above.

$Y^1$ to $Y^4$ is each independently represents an oxygen atom, a sulfur atom, a selenium atom, or a tellurium atom. t represents an integer of 1 to 3. Ra, Rb, and Rc each independently represent a hydrogen atom or an alkyl group.

Examples of the heterocyclic group include a furyl group, a thiofuryl group, a pyridyl group, a pyrazole group, an imidazolyl group, a benzimidazolyl group, an indolyl group, a quinolyl group, an isoquinolyl group, a purine group, a pyrimidyl group, a pirazyl group, an oxazolyl group, a thiazolyl group, a triazyl group, a carbazolyl group, a quinoxalyl group, a thiazine group, and the like.

Here, in a case where the pKa of conjugate acid of the anion represented by $X^{21-}$ is −10 to −3.7, at least three groups among $R^{51}$ to $R^{54}$ are an organic group having 8 or more carbon atoms. The organic group having 8 or more carbon atoms means an organic group which is selected from the group consisting of a hydrocarbon group that may contain a heteroatom, a heterocyclic group, and a group obtained by combining two or more of these groups and contains 8 or more carbon atoms.

From the viewpoint of thermoelectric conversion performance, the content of the onium salt in n-type thermoelectric conversion layer with respect to the total mass of the nanocarbon material in the n-type thermoelectric conversion layer is preferably 0.01% to 20% by mass, more preferably 0.05% to 10% by mass, and even more preferably 0.1% to 5% by mass.

Only one kind of onium salt may be used singly, or two or more kinds of onium salts may be used in combination.

From the viewpoint of improving thermoelectric performance and the like, the average thickness of the n-type thermoelectric conversion layer is preferably 1 to 500 μm, more preferably 5 to 500 μm, and even more preferably 10 to 500 μm.

The average thickness of the n-type thermoelectric conversion layer is determined by measuring thicknesses of the n-type thermoelectric conversion layer at 10 random points and calculating the arithmetic mean thereof.

(Manufacturing Method of n-Type Thermoelectric Conversion Layer)

The method for manufacturing the n-type thermoelectric conversion layer is not particularly limited, and examples thereof include the following two methods.

(First method) A method of using a composition for forming an n-type thermoelectric conversion layer containing a nanocarbon material and an onium salt (Second method) A method of preparing an n-type thermoelectric conversion layer precursor by using a composition for forming an n-type thermoelectric conversion layer precursor containing a nanocarbon material and then forming an n-type thermoelectric conversion layer by applying an onium salt to the n-type thermoelectric conversion layer precursor.

The procedure of the above methods is the same as that of the manufacturing method of the p-type thermoelectric conversion layer described above.

[Substrate]

The type of the substrate is not particularly limited as long as the substrate functions to support various members which will be described later. It is preferable to select a substrate which is hardly affected at the time of forming an electrode and a thermoelectric conversion layer.

Examples of such a substrate include a resin substrate, a glass substrate, a transparent ceramic substrate, and a metal substrate. Among these, from the viewpoint of cost and flexibility, a resin substrate is preferable.

More specifically, examples of the resin substrate include a polyester substrate such as polyethylene terephthalate, polyethylene isophthalate, polyethylene naphthalate, polybutylene terephthalate, poly(1,4-cyclohexylenedimethylene-terephthalate), or polyethylene-2,6-naphthalenedicarboxylate, a polycycloolefin substrate such as a ZEONOR film (trade name, manufactured by ZEON CORPORATION), an ARTON film (trade name, manufactured by JSR Corporation), or SUMILITE FS1700 (trade name, manufactured by Sumitomo Bakelite Co. Ltd.), a polyimide substrate such as KAPTON (trade name, manufactured by DU PONT-TORAY CO., LTD.), APICAL (trade name, manufactured by Kaneka Corporation), UPILEX (trade name, manufactured by UBE INDUSTRIES, LTD.), or POMIRAN (trade name, manufactured by Arakawa Chemical Industries, Ltd.), a polycarbonate substrate such as PUREACE (trade name, manufactured by TEIJIN LIMITED) or ELMEC (trade name, manufactured by Kaneka Corporation), a polyether ether ketone substrate such as SUMILITE FS1100 (trade name, manufactured by Sumitomo Bakelite Co., Ltd.), a polyphenyl sulfide substrate such as TORELINA (trade name, manufactured by TORAY INDUSTRIES, INC.), a polyacetal substrate, a polyamide substrate, a polyphenylene ether substrate, a polyolefin substrate (for example, a polyethylene substrate), a polystyrene substrate, a polyarylate substrate, a polysulfone substrate, a polyether sulfone substrate, a fluororesin substrate, a liquid crystal polymer substrate, and the like. From the viewpoint of ease of availability, heat resistance (preferably equal to or higher than 100° C.), and further improving the effects of the present invention, a polyimide substrate is preferable.

In view of handleability, durability, and the like, the thickness of the substrate is preferably 5 to 1,000 µm, more preferably 5 to 500 µm, even more preferably 5 to 100 µm, and particularly preferably 5 to 50 µm.

[Electrode]

The electrode material constituting the electrodes (the first electrode, the second electrode, and the third electrode) is not particularly limited, and examples thereof include a transparent electrode material such as Indium-Tin-Oxide (ITO) or ZnO, a metal electrode material such as silver, copper, gold, or aluminum, a carbon material such as CNT or graphene, and an organic material such as poly(3,4-ethylenedioxythiophene) (PEDOT)/polystyrene sulfonate (PSS), or PEDOT/tosylate (Tos). The electrodes can be formed using a conductive paste in which conductive fine particles of gold, silver, copper, or carbon are dispersed, solder, a conductive paste containing metal nanowires of gold, silver, copper, or aluminum, and the like.

Hitherto, aspects of the thermoelectric conversion element shown in FIG. 1 have been described. However, as long as the thermoelectric conversion element includes the p-type thermoelectric conversion layer and the n-type thermoelectric conversion layer described above, and the difference in the ionization potential between the p-type thermoelectric conversion layer and the n-type thermoelectric conversion layer is within a predetermined range, the constitution of the thermoelectric conversion element is not particularly limited.

Figure 2:
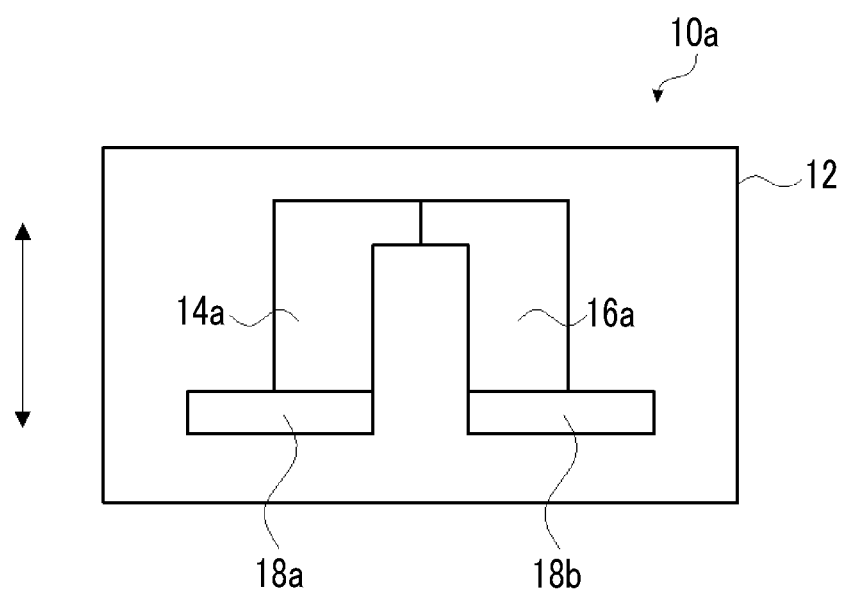
FIG. 2 is a top view schematically showing another example of the thermoelectric conversion element of the embodiment of the present invention.

For example, as shown in FIG. 2, a p-type thermoelectric conversion layer 14a and an n-type thermoelectric conversion layer 16a may directly contact each other.

Figure 3:
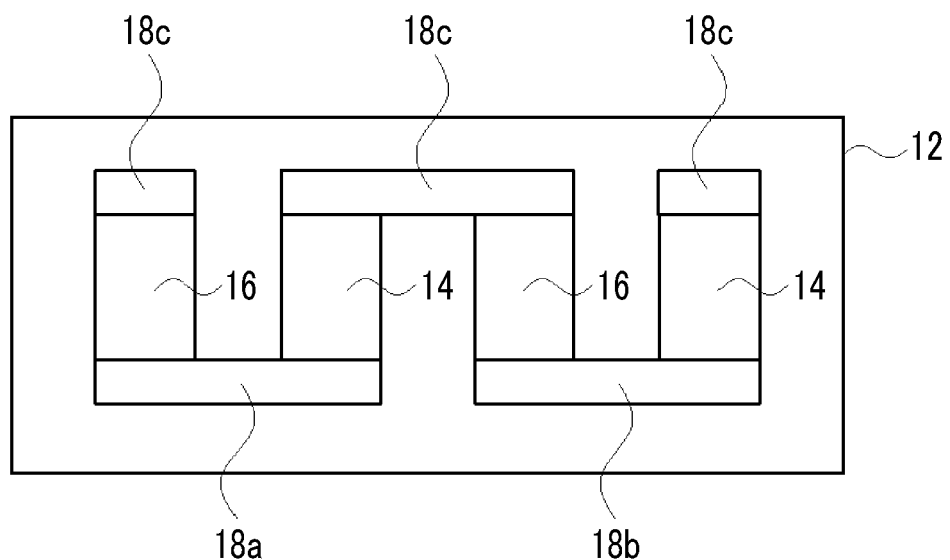
FIG. 3 is a top view schematically showing an example of a thermoelectric conversion module.

For example, as shown in FIG. 3, by alternately disposing a plurality of p-type thermoelectric conversion layers 14 and n-type thermoelectric conversion layers 16 on the substrate 12 and connecting the p-type thermoelectric conversion layers and the n-type thermoelectric conversion layers to each other through electrodes, the thermoelectric conversion element can obtain a higher voltage.

As shown in FIG. 3, in the present invention, by electrically connecting a plurality of thermoelectric conversion elements, a so-called module (thermoelectric conversion module) may be constituted.

[Article for Thermoelectric Power Generation]

The article for thermoelectric power generation of the embodiment of the present invention is an article for thermoelectric power generation using the thermoelectric conversion element of the embodiment of the present invention.

Specific examples of the article for thermoelectric power generation include a power generator such as a hot spring heat power generator, a solar power generator, or a waste heat power generator, a power supply for a wristwatch, a power supply for driving a semiconductor, a power supply for a small sensor, and the like. In addition, the article for thermoelectric power generation of the embodiment of the present invention can also be used as a Peltier element for cooling, temperature control, and the like.

That is, the aforementioned thermoelectric conversion element of the embodiment of the present invention can be suitably used for the above uses.

EXAMPLES

Hereinafter, the present invention will be more specifically described based on examples, but the present invention is not limited thereto.

Example 1

(Preparation of p-Type Thermoelectric Conversion Layer)

By using a mechanical homogenizer (manufactured by SMT Corporation, HIGH-FLEX HOMOGENiZER HF93), 40 mg of single-layer CNT (Tuball manufactured by OCSiAl) and 32 mL of acetone were mixed together for 5 minutes at 18,000 rpm, thereby obtaining a dispersion liquid. Then, the dispersion was filtered under reduced pressure by using a glass filter equipped with a membrane filter made of polytetrafluoroethylene (PTFE) and a suction bottle, thereby obtaining a CNT film on the membrane filter. The obtained CNT film was cut in a size of 1 cm×3 cm.

The cut CNT film was immersed in 5.3 mL of a methanol solution containing 9.4 mM pyridine hydrochloride. The CNT film was immersed in the methanol solution for 2 hours at 25° C. and then pulled up from the methanol solution, and the obtained CNT film was rinsed with methanol. The rinsed CNT film was dried for 2 hours at 30° C. in a vacuum, thereby obtaining a p-type CNT film (corresponding to a p-type thermoelectric conversion layer).

(Preparation of n-Type Thermoelectric Conversion Layer)

An n-type CNT film (corresponding to an n-type thermoelectric conversion layer) was obtained according to the same procedure as that in (Preparation of p-type thermoelectric conversion layer), except that the pyridine hydrochloride was changed to methyl trioctylammonium chloride.

(Preparation of Pn Junction Element)

As shown in FIG. 1, the p-type CNT film (p-type thermoelectric conversion layer 14) and the n-type CNT film (n-type thermoelectric conversion layer 16) were placed on a polyimide substrate and fixed using a double-sided tape. The polyimide substrate was coated with a silver paste such that the electrodes (the first electrode 18*a*, the second electrode 18*b*, and the third electrode 18*c*) shown in FIG. 1 were formed. Thereafter, the polyimide substrate coated with the silver paste was dried for 1 hour at 120° C., thereby obtaining a pn junction element (corresponding to a thermoelectric conversion element) in which the p-type CNT film and the n-type CNT film were electrically connected to each other.

Example 2

By using a mechanical homogenizer (manufactured by SMT Corporation, HIGH-FLEX HOMOGENiZER HF93), 40 mg of single-layer CNT (Tuball manufactured by OCSiAl) and 32 mL of acetone were mixed together for 5 minutes at 18,000 rpm, thereby obtaining a dispersion liquid. Then, the dispersion liquid was filtered under reduced pressure by using a glass filter equipped with a membrane filter made of polytetrafluoroethylene (PTFE) and a suction bottle, thereby obtaining a CNT film on the membrane filter. The CNT film was cut in a U shape having a width of 1 cm.

For the obtained U-shaped CNT film, one half thereof from the center was immersed in a methanol solution containing 9.4 mM pyridine hydrochloride, and at the same time, the other half was immersed in a methanol solution containing 9.4 mM methyl trioctylammonium chloride. After being immersed in the two kinds of methanol solutions for 2 hours at 25° C., the CNT film was pulled up from the methanol solutions, and the obtained CNT film was rinsed with methanol. Thereafter, the rinsed CNT film was dried for 2 hours at 30° C. in a vacuum and disposed on a polyimide substrate (substrate 12) as shown in FIG. 2, and end portions of the CNT film were coated with a silver paste such that the electrodes (the first electrode 18*a* and the second electrode 18*b*) shown in FIG. 2 were formed. Then, the polyimide substrate coated with the silver paste was dried for 1 hour at 120° C., thereby obtaining a pn junction element (corresponding to a thermoelectric conversion element) in which the p-type CNT film (p-type thermoelectric conversion layer 14*a*) and the n-type CNT film (n-type thermoelectric conversion layer 16*a*) were electrically connected to each other.

[Example 3] to [Example 7], [Examples 9 to 11], [Examples 13 to 15], [Example 19 to Example 25], [Example 29 to Example 42], and [Example 44 to Example 46]

pn junction elements were obtained according to the same procedure as that in Example 1, except that the materials were changed to those described in Table 1.

Example 8

A pn junction element was obtained according to the same procedure as that in Example 1, except that the methanol solution containing 9.4 mM pyridine hydrochloride was changed to a methanol solution containing 0.1 mM pyrenemethylamine hydrochloride.

Example 12

A pn junction element was obtained according to the same procedure as that in Example 1, except that the pyridine hydrochloride was changed to sodium chloride, the solvent was changed to a mixed solvent of water-methanol (1:1) from methanol, and the methyl trioctylammonium chloride was changed to tetraoctylammonium bromide.

Example 16

A pn junction element was obtained according to the same procedure as that in Example 1, except that the pyridine hydrochloride was changed to calcium bis(trifluoromethanesulfonyl)imide (concentration: 0.25% by mass).

Example 17

A pn junction element was obtained according to the same procedure as that in Example 1, except that the pyridine hydrochloride was changed to magnesium bis(trifluoromethanesulfonyl)imide (concentration: 0.25% by mass).

Example 18

A pn junction element was obtained according to the same procedure as that in Example 1, except that the pyridine hydrochloride was changed to zinc (II) bis(trifluoromethanesulfonyl)imide (concentration: 0.25% by mass).

Example 26

A pn junction element was obtained according to the same procedure as that in Example 1, except that the methanol solution containing 9.4 mM pyridine hydrochloride was changed to a methanol solution containing 1 mM (4-tert-butylphenyl)iodonium hexafluorophosphate.

Example 27

A pn junction element was obtained according to the same procedure as that in Example 1, except that the methanol solution containing 9.4 mM pyridine hydrochloride was changed to a methanol solution containing 1 mM trimethyloxonium tetrafluoroborate.

Example 28

A pn junction element was obtained according to the same procedure as that in Example 1, except that the methanol solution containing 9.4 mM pyridine hydrochloride was changed to a methanol solution containing 1 mM triphenylmethylium tetrakis(pentafluorophenyl)borate.

Example 43

(Preparation of p-Type Thermoelectric Conversion Layer)

By using a mechanical homogenizer (manufactured by SMT Corporation, HIGH-FLEX HOMOGENiZER HF93), 40 mg of single-layer CNT (Tuball manufactured by OCSiAl) and 32 mL of acetone were mixed together for 5 minutes at 18,000 rpm, thereby obtaining a dispersion liquid. Then, the dispersion liquid was filtered under reduced pressure by using a glass filter equipped with a membrane filter made of PTFE and a suction bottle, thereby obtaining a CNT film on the membrane filter. The obtained CNT film was dried for 30 minutes at 50° C. and then for 30 minutes at 120° C. and then cut in a size of 1 cm×3 cm.

The cut CNT film was immersed in 5.3 mL of ethanol solution containing 2% by mass [2-(methacryloyloxy)ethyl] trimethylammonium bis(trifluoromethanesulfonyl)imide and subjected to nitrogen purging. Azobisisobutyronitrile (0.7 mg) was added to the ethanol solution, and the solution was polymerized for 2 hours under the condition of heating under reflux. After the polymerization was finished, the CNT film was pulled up from the ethanol solution and rinsed with methanol. Then, the rinsed CNT film was dried for 2 hours at 30° C. in a vacuum, thereby obtaining a p-type CNT film containing the following polymer 1.

Polymer 1

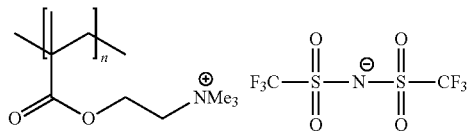

A pn junction element was obtained according to the same procedure as that in Example 1, except that the obtained p-type CNT film was used.

Comparative Example 1

A pn junction element was obtained according to the same procedure as that in Example 1, except that the methanol solution containing 9.4 mM pyridine hydrochloride was changed to a methanol solution containing 38 mM pyrenemethylamine hydrochloride, and the methyl trioctylammonium chloride was changed to tetraoctylammonium hydroxide.

Comparative Example 2

A pn junction element was obtained according to the same procedure as that in Example 1, except that the pyridine hydrochloride was changed to tetracyanoquinodimethane (TCNQ), and the methyl trioctylammonium chloride was changed to tetraoctylammonium hydroxide.

Comparative Example 3

A pn junction element was obtained according to the same procedure as that in Example 1, except that the immersion in the pyridine hydrochloride solution was not performed, and the methyl trioctylammonium chloride was changed to tetrabutylammonium hydroxide.

<Various Evaluations>

(Measurement of Difference in Ionization Potential)

In the atmosphere, the ionization potential (Fermi level) of each of the p-type CNT films (p-type thermoelectric conversion layers) and the n-type CNT films (n-type thermoelectric conversion layers) of the examples and the comparative examples was measured using an atmospheric photoelectron spectrometer (AC-2, manufactured by RIKEN KEIKI Co., Ltd), and a difference in ionization potential (Ip) was calculated according to the following formula.

Difference in Ip=(Ip of p-type thermoelectric conversion layer)−(Ip of n-type thermoelectric conversion layer)

The method for measuring the ionization potential was performed under the condition of the apparatus of the amount of light of 20 nW, a measurement interval of 0.05 eV, a measurement range of 4 to 5.5 eV, and a power of 0.5. In the obtained graph (ordinate: eV, abscissa: amount of light), a point of intersection between a flat portion (baseline) and a regression line was adopted as the ionization potential (threshold of photoelectron emission).

(Element Performance: Power Generation Capacity)

Figure 4:
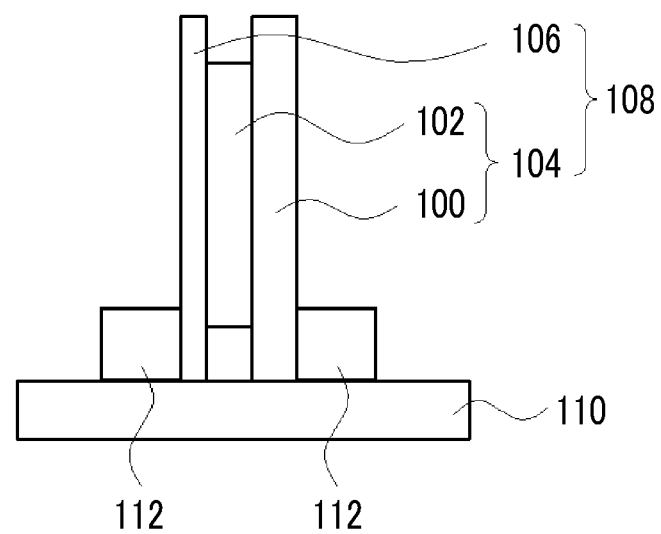
FIG. 4 is a conceptual view showing an apparatus for measuring power generation capacity which is an element performance.

By using each of the pn junction elements obtained in the examples and the comparative examples, a measurement apparatus shown in FIG. 4 was prepared.

Specifically, as shown in FIG. 4, an aramid film 106 was disposed on a thermoelectric conversion layer 102 side in a pn junction element 104 including a polyimide substrate 100 and a thermoelectric conversion layer 102 (a p-type thermoelectric conversion layer and an n-type thermoelectric conversion layer), thereby preparing a thermoelectric conversion element 108. Then, in order that one end side (the first electrode 18a side and the second electrode 18b side in FIG. 1) of the thermoelectric conversion element 108 could be efficiently heated, one end of the thermoelectric conversion element 108 was fixed by being interposed between copper plates 112 disposed on a hot plate 110.

Then, terminals (not shown in the drawing) of a source meter (manufactured by Keithley Instruments, Inc.) were mounted on extraction electrodes (not shown in the drawing) at both ends of the thermoelectric conversion element 108, and the temperature of the hot plate 110 was caused to remain constant at 100° C. such that a temperature difference was caused in the thermoelectric conversion element 108.

The current-voltage characteristics of the thermoelectric conversion element 108 were measured, and a short-circuit current and an open voltage were measured. From the measured results, a power generation capacity was calculated by "(Power generation capacity)=[(Current)×(Voltage)/4]".

According to the above procedure, ten thermoelectric conversion elements 108 were prepared, and the power generation capacity of each of the elements was calculated. By calculating the arithmetic mean of the obtained values, the average power generation capacity was obtained. Furthermore, a normalized power generation capacity was calculated by the following formula and evaluated based on the following standards.

Comparative Example 1 was used as a reference comparative example.

(Normalized power generation capacity)=(average power generation capacity of pn junction element of each example or each comparative example)/(average power generation capacity of pn junction element of Comparative Example 1)

A: The normalized power generation capacity was equal to or higher than 1.5.
B: The normalized power generation capacity was equal to or higher than 1.1 and less than 1.5.
C: The normalized power generation capacity was less than 1.1.

(Element Performance: Variation in Power Generation Capacity)

For each of the examples and the comparative examples, ten pn junction elements were prepared, and according to the same procedure as that in (Element performance: power generation capacity), the power generation capacity of each thermoelectric conversion element was measured. By using the obtained minimum power generation capacity and maximum power generation capacity, a variation in the power generation capacity was calculated by the following formula and evaluated based on the following standards.

Variation in power generation capacity=(minimum power generation capacity)−(maximum power generation capacity)

A: The variation in the power generation capacity was equal to or greater than 0.9.
B: The variation in the power generation capacity was equal to or greater than 0.7 and less than 0.9.
C: The variation in the power generation capacity was less than 0.7.

(Element Performance: Durability)

Each of the pn junction elements of the examples and the comparative examples was stored for 1 week in a constant-temperature tank at 100° C. Then, by using the pn junction element before storage and the pn junction element after storage, the average power generation capacity of each thermoelectric conversion element was measured according to the same procedure as that in (Element performance: power generation capacity), and a power generation capacity retention rate was calculated by the following formula and evaluated based on the following standards.

Power generation capacity retention rate=(average power generation capacity measured after storage for 1 week at 100° C.)/(average power generation capacity measured immediately after thermoelectric conversion element is prepared)

A: The power generation capacity retention rate was equal to or higher than 0.8.
B: The power generation capacity retention rate was equal to or higher than 0.6 and less than 0.8.
C: The power generation capacity retention rate was less than 0.6.

In Table 1, "Difference in Ip/eV" represents the difference between the ionization potential of the p-type thermoelectric conversion layer and the ionization potential of the n-type thermoelectric conversion layer.

Regarding "pKa" in the column of "p-Type thermoelectric conversion layer" in Table 1, "pKa" in Examples 1 to 9 and 19 to 46 and Comparative Example 1 represents a pKa of a conjugate acid of an anion contained in "Onium salt", and "pKa" in Examples 10 to 18 represents a pKa of a conjugate acid of an anion contained in "Inorganic salt".

Furthermore, "pKa" in the column of "n-Type thermoelectric conversion layer" in Table 1 represents a pKa of a conjugate acid of an anion contained in "Onium salt" in each of the examples and the comparative examples.

TABLE 1

| | p-Type thermoelectric conversion layer | | | n-Type thermoelectric conversion layer | | | | | Element performance | | |
|---|---|---|---|---|---|---|---|---|---|---|---|
| | Nanocarbon material | Onium salt or inorganic salt | pKa | Nanocarbon material | Onium salt | pKa | Difference in Ip/eV | Electrode | Power generation capacity | Variation | Durability |
| Example 1 | Single-layer CNT | Pyridine hydrochloride | −3.7 | Single-layer CNT | Methyl trioctylammonium chloride | −3.7 | 0.08 | Silver | A | A | A |
| Example 2 | Single-layer CNT | Pyridine hydrochloride | −3.7 | Single-layer CNT | Methyl trioctylammonium chloride | −3.7 | 0.08 | N/A | A | A | A |
| Example 3 | Single-layer CNT | Pyridine hydrochloride | −3.7 | Single-layer CNT | Tetraoctylammonium chloride | −3.7 | 0.08 | Silver | A | A | A |
| Example 4 | Single-layer CNT | Pyridine hydrochloride | −3.7 | Single-layer CNT | Tetraoctylammonium bromide | −4.1 | 0.07 | Silver | A | A | A |
| Example 5 | Single-layer CNT | Ammonium chloride | −3.7 | Single-layer CNT | Methyl trioctylammonium chloride | −3.7 | 0.04 | Silver | A | A | A |
| Example 6 | Single-layer CNT | Imidazole hydrochloride | −3.7 | Single-layer CNT | Methyl trioctylammonium chloride | −3.7 | 0.09 | Silver | A | A | A |
| Example 7 | Single-layer CNT | Piperidine hydrochloride | −3.7 | Single-layer CNT | Methyl trioctylammonium chloride | −3.7 | 0.09 | Silver | B | A | A |
| Example 8 | Single-layer CNT | Pyrenemethylamine hydrochloride | −3.7 | Single-layer CNT | Tetraoctylammonium chloride | −3.7 | 0.1 | Silver | B | A | A |
| Example 9 | Single-layer CNT | Tetramethylammonium chloride | −3.7 | Single-layer CNT | Methyl trioctylammonium chloride | −3.7 | 0.04 | Silver | A | A | A |
| Example 10 | Single-layer CNT | LiCl | −3.7 | Single-layer CNT | Methyl trioctylammonium chloride | −3.7 | 0.08 | Silver | A | A | A |
| Example 11 | Single-layer CNT | LiBr | −4.1 | Single-layer CNT | Methyl trioctylammonium chloride | −3.7 | 0.08 | Silver | A | A | A |
| Example 12 | Single-layer CNT | NaCl | −3.7 | Single-layer CNT | Tetraoctylammonium bromide | −4.1 | 0.06 | Silver | A | A | A |
| Example 13 | Single-layer CNT | Li(TFSI) | Less than −10 | Single-layer CNT | Methyl trioctylammonium chloride | −3.7 | 0.08 | Silver | A | A | A |
| Example 14 | Single-layer CNT | Na(TFSI) | Less than −10 | Single-layer CNT | Methyl trioctylammonium chloride | −3.7 | 0.08 | Silver | A | A | A |
| Example 15 | Single-layer CNT | Cs(TFSI) | Less than −10 | Single-layer CNT | Methyl trioctylammonium chloride | −3.7 | 0.08 | Silver | A | A | A |
| Example 16 | Single-layer CNT | Ca(TFSI)$_2$ | Less than −10 | Single-layer CNT | Methyl trioctylammonium chloride | −3.7 | 0.08 | Silver | A | A | A |
| Example 17 | Single-layer CNT | Mg(TFSI)$_2$ | Less than −10 | Single-layer CNT | Methyl trioctylammonium chloride | −3.7 | 0.09 | Silver | A | A | A |
| Example 18 | Single-layer CNT | Zn(TFSI)$_2$ | Less than −10 | Single-layer CNT | Methyl trioctylammonium chloride | −3.7 | 0.09 | Silver | A | A | A |
| Example 19 | Single-layer CNT | Trimethylhexylammonium bis(trifluoromethanesulfonyl)imide | Less than −10 | Single-layer CNT | Methyl trioctylammonium chloride | −3.7 | 0.07 | Silver | A | A | A |
| Example 20 | Single-layer CNT | 1-Ethyl-1-methylpyrrolidinium hexafluorophosphate | Less than −10 | Single-layer CNT | Methyl trioctylammonium chloride | −3.7 | 0.08 | Silver | A | A | A |
| Example 21 | Single-layer CNT | 1-Ethyl-3-methylimidazolium bis(trifluoromethanesulfonyl)imide | Less than −10 | Single-layer CNT | Methyl trioctylammonium chloride | −3.7 | 0.08 | Silver | A | A | A |
| Example 22 | Single-layer CNT | 1-Butylpyridinium tetrafluoroborate | Less than −10 | Single-layer CNT | Methyl trioctylammonium chloride | −3.7 | 0.09 | Silver | A | A | A |
| Example 23 | Single-layer CNT | Tetrabutylphosphonium bis(trifluoromethanesulfonyl)imide | Less than −10 | Single-layer CNT | Methyl trioctylammonium chloride | −3.7 | 0.11 | Silver | B | B | B |
| Example 24 | Single-layer CNT | Tetrabutylphosphonium hexafluorophosphate | Less than −10 | Single-layer CNT | Methyl trioctylammonium chloride | −3.7 | 0.11 | Silver | B | B | B |
| Example 25 | Single-layer CNT | Triethylsulfonium bis(trifluoromethanesulfonyl)imide | Less than −10 | Single-layer CNT | Methyl trioctylammonium chloride | −3.7 | 0.12 | Silver | B | B | B |
| Example 26 | Single-layer CNT | Bis(4-tert-butylphenyl)iodonium hexafluorophosphate | Less than −10 | Single-layer CNT | Methyl trioctylammonium chloride | −3.7 | 0.12 | Silver | B | B | B |
| Example 27 | Single-layer CNT | Trimethyloxonium tetrafluoroborate | Less than −10 | Single-layer CNT | Methyl trioctylammonium chloride | −3.7 | 0.11 | Silver | B | B | B |
| Example 28 | Single-layer CNT | Triphenylmethylium tetrakis(pentafluorophenyl)borate | Less than −10 | Single-layer CNT | Methyl trioctylammonium chloride | −3.7 | 0.11 | Silver | B | B | B |

TABLE 1-continued

| | p-Type thermoelectric conversion layer | | | n-Type thermoelectric conversion layer | | | | | Element performance | | |
|---|---|---|---|---|---|---|---|---|---|---|---|
| | Nanocarbon material | Onium salt or inorganic salt | pKa | Nanocarbon material | Onium salt | pKa | Difference in Ip/eV | Electrode | Power generation capacity | Variation | Durability |
| Example 29 | Single-layer CNT | Pyridine hydrochloride | −3.7 | Single-layer CNT | Tetrabutylammonium fluoride | 2.7 | 0.11 | Silver | B | B | B |
| Example 30 | Single-layer CNT | Pyridine hydrochloride | −3.7 | Single-layer CNT | Tetraoctylammonium iodide | −10 | 0.03 | Silver | B | B | B |
| Example 31 | Single-layer CNT | Pyridine hydrochloride | −3.7 | Single-layer CNT | Tetrabutylammonium hydroxide | 15 | 0.13 | Silver | B | B | B |
| Example 32 | Single-layer CNT | Pyridine hydrochloride | −3.7 | Single-layer CNT | Tetraoctylammonium sulfate | −1.8 | 0.12 | Silver | B | B | B |
| Example 33 | Single-layer CNT | Pyridine hydrochloride | −3.7 | Single-layer CNT | Tetrahexylammonium phosphate | 1.8 | 0.11 | Silver | B | B | B |
| Example 34 | Single-layer CNT | Pyridine hydrochloride | −3.7 | Single-layer CNT | Tetraoctylammonium bisulfate | −3 | 0.11 | Silver | B | B | B |
| Example 35 | Single-layer CNT | Pyridine hydrochloride | −3.7 | Single-layer CNT | Tetrabutylammonium acetate | 4.8 | 0.11 | Silver | B | B | B |
| Example 36 | Single-layer CNT | Tetramethylammonium trifluoromethanesulfonate | Less than −10 | Single-layer CNT | Methyl trioctylammonium chloride | −3.7 | 0.08 | Silver | B | B | B |
| Example 37 | Single-layer CNT | Tetrabutylammonium bisulfate | −3 | Single-layer CNT | Methyl trioctylammonium chloride | −3.7 | 0.08 | Silver | A | A | A |
| Example 38 | Single-layer CNT | 1-Butyl-1-methylpyrrolidinium hexafluorophosphate | Less than −10 | Single-layer CNT | Methyl trioctylammonium chloride | −3.7 | 0.07 | Silver | A | A | A |
| Example 39 | Single-layer CNT | 1-Butyl-1-methylpyrrolidinium tetrafluoroborate | Less than −10 | Single-layer CNT | Methyl trioctylammonium chloride | −3.7 | 0.09 | Silver | A | A | A |
| Example 40 | Single-layer CNT | 1-Butyl-1-methyl pyrrolidinium bromide | −4.1 | Single-layer CNT | Methyl trioctylammonium chloride | −3.7 | 0.08 | Silver | A | A | A |
| Example 41 | Single-layer CNT | 1-Ethyl-1-3-methylimidazolium bis(trifluoromethanesulfonyl)imide | Less than −10 | Single-layer CNT | Methyl trioctylammonium chloride | −3.7 | 0.07 | Silver | A | A | A |
| Example 42 | Single-layer CNT | Methyl tributylphosphonium bis(trifluoromethanesulfonyl)imide | Less than −10 | Single-layer CNT | Methyl trioctylammonium chloride | −3.7 | 0.07 | Silver | B | B | B |
| Example 43 | Single-layer CNT | Polymer 1 | Less than −10 | Single-layer CNT | Methyl trioctylammonium chloride | −3.7 | 0.08 | Silver | B | A | A |
| Example 44 | Single-layer CNT | Pyridine hydrochloride | −3.7 | Single-layer CNT | Tetrabutylphosphonium hydroxide | 15 | 0.08 | Silver | B | B | B |
| Example 45 | Single-layer CNT | 1-Methyl-1-propylpyrrolidinium bis(trifluoromethanesulfonyl)imide | Less than −10 | Single-layer CNT | Methyl trioctylammonium chloride | −3.7 | 0.07 | Silver | A | A | A |
| Example 46 | Single-layer CNT | 1-Butyl-1-methylpiperidinium bis(trifluoromethanesulfonyl)imide | Less than −10 | Single-layer CNT | Methyl trioctylammonium chloride | −3.7 | 0.08 | Silver | A | A | A |
| Comparative Example 1 | Single-layer CNT | Pyrenemethylamine hydrochloride | −3.7 | Single-layer CNT | Tetraoctylammonium hydroxide | 15 | 0.18 | Silver | C | C | C |
| Comparative Example 2 | Single-layer CNT | TCNQ | — | Single-layer CNT | Tetraoctylammonium hydroxide | 15 | 0.21 | Silver | C | C | C |
| Comparative Example 3 | Single-layer CNT | N/A | — | Single-layer CNT | Tetrabutylammonium hydroxide | 15 | 0.16 | Silver | C | C | C |

As shown in Table 1, it was confirmed that the desired effects were obtained in Examples 1 to 46 in which the difference between the ionization potential of the p-type thermoelectric conversion layer and the ionization potential of the n-type thermoelectric conversion layer was equal to or smaller than 0.15 eV.

Particularly, through the comparison between Examples 19 to 22 and Examples 23 to 28, it was confirmed that in a case where $Z^{11}$ in Formula (1A) represented a nitrogen atom, the effects were further improved. Furthermore, it was confirmed that in a case where the difference between the ionization potential of the p-type thermoelectric conversion layer and the ionization potential of the n-type thermoelectric conversion layer was equal to or smaller than 0.10 eV, the effects were further improved.

In addition, through the comparison between Example 1 and Examples 29 to 35, it was confirmed that in a case where the difference between the ionization potential of the p-type thermoelectric conversion layer and the ionization potential of the n-type thermoelectric conversion layer was 0.04 to 0.10 eV, the effects were further improved.

In contrast, in Comparative Examples 1 and 2 in which a predetermined difference in Ip was not obtained and in (Preparation of n-Type Thermoelectric Conversion Layer)

An n-type graphene film (corresponding to an n-type thermoelectric conversion layer) was obtained according to the same procedure as that in (Preparation of p-type thermoelectric conversion layer), except that the pyridine hydrochloride was changed to methyl trioctylammonium chloride.

A pn junction element was obtained according to the same procedure as that in Example 1, except that the aforementioned p-type graphene film was used instead of the p-type CNT film, and the aforementioned n-type graphene film was used instead of the n-type CNT film.

Comparative Example 4

A pn junction element was obtained according to the same procedure as that in Example 47, except that the methanol solution containing 9.4 mM of pyridine hydrochloride was changed to a methanol solution containing 38 mM pyrenemethylamine hydrochloride, and the trimethylammonium chloride was changed to tetraoctylammonium hydroxide.

By using the pn junction elements obtained in Example 47 and Comparative Example 4, the element performance (power generation capacity, variation, and durability) was evaluated according to the procedure described above. Comparative Example 4 was used as a reference comparative example. The results are shown in Table 2.

TABLE 2

| | p-Type thermoelectric conversion layer | | n-Type thermoelectric conversion layer | | | | Element performance | | |
|---|---|---|---|---|---|---|---|---|---|
| | Nanocarbon material | Onium salt or inorganic salt | Nanocarbon material | Onium salt | Difference in Ip/eV | Electrode | Power generation capacity | Variation | Durability |
| Example 47 | Graphene | Pyridine hydrochloride | Graphene | Methyl trioctylammonium chloride | 0.07 | Silver | A | A | A |
| Comparative Example 4 | Graphene | Pyrenemethylamine hydrochloride | Graphene | Tetraoctylammonium hydroxide | 0.18 | Silver | C | C | C |

Comparative Example 3 in which a p-type thermoelectric conversion layer was not used, the desired effects were not obtained.

Example 47

(Preparation of p-Type Thermoelectric Conversion Layer)

By using a mechanical homogenizer (manufactured by SMT Corporation, HIGH-FLEX HOMOGENiZER HF93), 40 mg of graphene (trade name: "GRAPHENE NANOPLATELET", manufactured by TOKYO CHEMICAL INDUSTRY CO., LTD.) and 32 mL of acetone were mixed together for 5 minutes at 18,000 rpm, thereby obtaining a dispersion liquid. The dispersion liquid was filtered under reduced pressure by using a glass filter equipped with a membrane filter made of PTFE and a suction bottle, thereby obtaining a graphene film on the membrane filter. The obtained graphene film was dried for 30 minutes at 50° C. and then for 30 minutes at 120° C., and then cut in a size of 1 cm×3 cm.

The cut graphene film was immersed in 5.3 mL of a methanol solution containing 9.4 mM pyridine hydrochloride (manufactured by TOKYO CHEMICAL INDUSTRY CO., LTD.). The graphene film was immersed in the methanol solution for 2 hours at 25° C. and then pulled up from the methanol solution, and the obtained graphene film was rinsed with methanol. Thereafter, the rinsed graphene film was dried for 2 hours at 30° C. in a vacuum, thereby obtaining a p-type graphene film.

As shown in Table 2, it was confirmed that even in a case where graphene was used, the desired effects were obtained.

Example 48

A pn junction element was obtained according to the same procedure as that in Example 1, except that the single-layer CNT was changed to double-layered CNT.

Example 49

A pn junction element was obtained according to the same procedure as that in Example 1, except that the single-layer CNT was changed to multilayered CNT.

By using the pn junction elements obtained in Examples 1 and 47 to 49, the element performance (power generation capacity, variation, and durability) was evaluated according to the procedure described above.

It was confirmed that in all of Examples 1 and 47 to 49, the desired effects were obtained.

Particularly, by comparing the result of Example 1 with the results of Examples 47 to 49, it was confirmed that in a case where double-layered CNT or single-layer CNT was used as a nanocarbon material, the power generation capacity was further improved, and in a case where single-layer CNT was used, the power generation capacity was still further improved.

Example 50

A pn junction element was obtained according to the same procedure as that in Example 1.

Example 51

A pn junction element was obtained according to the same procedure as that in Example 1, except that the drying performed for 2 hours at 30° C. in a vacuum was changed to drying performed for 3 hours at 100° C. in a vacuum.

Example 52

A pn junction element was obtained according to the same procedure as that in Example 1, except that the drying performed for 2 hours at 30° C. in a vacuum was changed to drying performed for 1 hour at 150° C. in a vacuum.

Comparative Example 5

A pn junction element was obtained according to the same procedure as that in Example 50, except that the immersion in a methanol solution containing pyridine hydrochloride was not performed.

By using the pn junction elements obtained in Examples 50 to 52 and Comparative Example 5, the element performance (power generation capacity, variation, and durability) was evaluated according to the procedure described above. Comparative Example 5 was adopted as a reference comparative example. The results are shown in Table 3.

106: aramid film
110: hot plate
112: copper plate

What is claimed is:
1. A thermoelectric conversion element comprising:
a p-type thermoelectric conversion layer; and
an n-type thermoelectric conversion layer electrically connected to the p-type thermoelectric conversion layer,
wherein the p-type thermoelectric conversion layer contains a nanocarbon material and at least one kind of component selected from the group consisting of an onium salt and an inorganic salt,
the n-type thermoelectric conversion layer contains a nanocarbon material and an onium salt, and
a difference between an ionization potential of the p-type thermoelectric conversion layer and an ionization potential of the n-type thermoelectric conversion layer is equal to or smaller than 0.15 eV,
the onium salt contained in the n-type thermoelectric conversion layer being an onium salt represented by Formula (2),

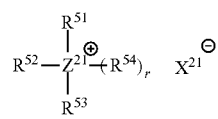

(2)

TABLE 3

| | p-Type thermoelectric conversion layer | | n-Type thermoelectric conversion layer | | Vacuum drying condition | Difference in Ip/eV | Electrode | Element performance | | |
|---|---|---|---|---|---|---|---|---|---|---|
| | | | | | | | | Power generation capacity | Variation | Durability |
| | Nanocarbon material | Onium salt or inorganic salt | Nanocarbon material | Onium salt | | | | | | |
| Example 50 | Single-layer CNT | Pyridine hydrochloride | Single-layer CNT | Methyl trioctylammonium chloride | 30° C. 2 h | 0.08 | Silver | A | A | A |
| Example 51 | Single-layer CNT | Pyridine hydrochloride | Single-layer CNT | Methyl trioctylammonium chloride | 100° C. 3 h | 0.09 | Silver | A | A | A |
| Example 52 | Single-layer CNT | Pyridine hydrochloride | Single-layer CNT | Methyl trioctylammonium chloride | 150° C. 1 h | 0.09 | Silver | A | A | A |
| Comparative Example 5 | Single-layer CNT | N/A | Single-layer CNT | Methyl trioctylammonium chloride | 30° C. 2 h | 0.07 | Silver | C | C | C |

As shown in Table 3, it was confirmed that even though the drying condition was changed, the desired effects were obtained.

EXPLANATION OF REFERENCES

10, 10a, 108: thermoelectric conversion element
12: substrate
14, 14a: p-type thermoelectric conversion layer
16, 16a: n-type thermoelectric conversion layer
18a: first electrode
18b: second electrode
18c: third electrode
100: polyimide substrate
102: thermoelectric conversion layer
104: pn junction element where in Formula (2),
$Z^{21}$ represents a nitrogen atom, a phosphorus atom, a sulfur atom, or an oxygen atom,
in a case where $Z^{21}$ is a nitrogen atom or a phosphorus atom, r is 1, and in a case where $Z^{21}$ is a sulfur atom or an oxygen atom, r is 0,
$X^{21-}$ represents an anion whose conjugate acid has a pKa of −10 to −3,
$R^{51}$ to $R^{54}$ each independently represents a hydrogen atom or an organic group selected from the group consisting of a hydrocarbon group which may contain a heteroatom, a heterocyclic group, and a group obtained by combining two or more of these groups, and
in a case where the pKa of the conjugate acid of the anion represented by $X^{21-}$ is −10 to −3.7, at least three groups among $R^{51}$ to $R^{54}$ are organic groups each having 8 or more carbon atoms.

2. The thermoelectric conversion element according to claim 1,
wherein the onium salt contained in the p-type thermoelectric conversion layer is one kind of onium salt selected from the group consisting of an onium salt represented by Formula (1A) to an onium salt represented by Formula (1D) or a polymer having a residue obtained by removing one hydrogen atom from one kind of onium salt selected from the group consisting of the onium salt represented by Formula (1A) to the onium salt represented by Formula (1D), and
a pKa of a conjugate acid of an anion of the inorganic salt is equal to or lower than −3,

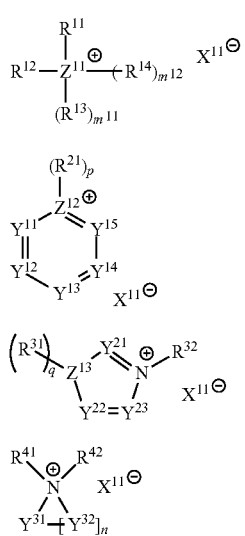

in Formula (1A),
$Z^{11}$ represents a nitrogen atom, a phosphorus atom, a sulfur atom, an oxygen atom, a carbon atom, or a halogen atom,
in a case where $Z^{11}$ is a nitrogen atom or a phosphorus atom, both of $m^{11}$ and $m^{12}$ are 1, in a case where $Z^{11}$ is a sulfur atom, an oxygen atom, or a carbon atom, $m^{11}$ is 1 and $m^{12}$ is 0, and in a case where is a halogen atom, both of $m^{11}$ and $m^{12}$ are 0,
$X^{11-}$ represents an, anion whose conjugate acid has a pKa equal to or lower than −3,
$R^{11}$ to $R^{14}$ each independently represent a hydrogen atom or an organic group selected from the group consisting of a hydrocarbon group which may contain a heteroatom, a heterocyclic group, and a group obtained by combining two or more of these groups,
in a case where $Z^{11}$ is a nitrogen atom, a phosphorus atom, a sulfur atom, an oxygen atom, or a carbon atom, and the pKa of the conjugate acid of the anion represented by $X^{11}$ is −10 to −3, at least three groups among $R^{11}$ to $R^{14}$ are a hydrogen atom or an organic group having 7 or less carbon atoms,
in a case where $Z^{11}$ is a halogen atom, and the pKa of the conjugate acid of the anion represented by $X^{11-}$ is −10 to −3, $R^{11}$ and $R^{12}$ are an organic group having 7 or less carbon atoms,
in Formula (1B),
$Z^{12}$ represents a nitrogen atom or an oxygen atom,
in a case where $Z^{12}$ is a nitrogen atom, p is 1, and in a case where $Z^{12}$ is an oxygen atom, p is 0,
$X^{11-}$ represents an anion whose conjugate acid has a pKa equal to or lower than −3,
$R^{21}$ represents a hydrogen atom or an organic group selected from the group consisting of a hydrocarbon group which may contain a heteroatom, a heterocyclic group, and a group obtained by combining two or more of these groups, $Y^{11}$ to $Y^{15}$ each independently represent a nitrogen atom or $=CR^{61}$—, and $R^{61}$ represents a hydrogen atom, an aliphatic hydrocarbon group, a halogen atom, a cyano group, a nitro group, an alkoxycarbonyl group, an acyl group, an alkoxy group, an alkylthio group, an acyloxy group, a formyl group, a thioester group, an amide group, a sulfonamide group, a carboxyl group, a hydroxyl group, a thiol group, an aralkyl group, an aryl group, or a heterocyclic group,
in a case where the pKa of the conjugate acid of the anion represented by $X^{11-}$ is −10 to −3, $R^{21}$ is a hydrogen atom or an organic group having 7 or less carbon atoms,
in Formula (1C),
$Z^{13}$ represents a nitrogen atom, an oxygen atom, or a sulfur atom,
in a case where $Z^{13}$ is a nitrogen atom, q is 1, and in a case where $Z^{13}$ is an oxygen atom or a sulfur atom, q is 0,
$X^{11-}$ represents an anion whose conjugate acid has a pKa equal to or lower than −3,
$R^{31}$ and $R^{32}$ each independently represent a hydrogen atom or an organic group selected from the group consisting of a hydrocarbon group which may contain a heteroatom, a heterocyclic group, and a group obtained by combining two or more of these groups, $Y^{21}$ to $Y^{23}$ each independently represent a nitrogen atom or $=CR^{61}$—, and $R^{61}$ represents a hydrogen atom, an aliphatic hydrocarbon group, a halogen atom, a cyano group, a nitro group, an alkoxycarbonyl group, an acyl group, an alkoxy group, an alkylthio group, an acyloxy group, a formyl group, a thioester group, an amide group, a sulfonamide group, a carboxyl group, a hydroxyl group, a thiol group, an aralkyl group, an aryl group, or a heterocyclic group,
in a case where the pKa of the conjugate acid of the anion represented by $X^{11-}$ is −10 to −3, $R^{31}$ and $R^{32}$ are a hydrogen atom or an organic group having 7 or less carbon atoms,
in Formula (1D),
$X^{11-}$ represents an anion whose conjugate acid has a pKa equal to or lower than −3,
$R^{41}$ and $R^{42}$ each independently represent a hydrogen atom or an organic group selected from the group consisting of a hydrocarbon group which may contain a heteroatom, a heterocyclic group, and a group obtained by combining two or more of these groups, $Y^{31}$ and $Y^{32}$ each independently represent $—C(R^{62})_2—$, $—NR^{63}—$, $—O—$, $—C(=O)—$, $—CO_2—$, $—S—$, $—SO—$, or $—SO_2—$, $R^{62}$ represents a hydrogen atom, an aliphatic hydrocarbon group, a halogen atom, an aralkyl group, an aryl group, or a heterocyclic group, and $R^{63}$ represents a hydrogen atom, an aliphatic hydrocarbon group, an aralkyl group, an aryl group, or a heterocyclic group,
n represents an integer of 1 to 18,
in a case where the pKa of the conjugate acid of the anion represented by $X^{11-}$ is −10 to −3, $R^{41}$ and $R^{42}$ are a hydrogen atom or an organic group having 7 or less carbon atoms.

3. The thermoelectric conversion element according to claim 2,
wherein the p-type thermoelectric conversion layer contains at least one kind of component selected from the group consisting of an onium salt represented by Formula (1A) in which $Z^{11}$ is a nitrogen atom, an onium salt represented by Formula (1B) in which $Z^{12}$ is a nitrogen atom, an onium salt represented by Formula (1C) in which $Z^{13}$ is a nitrogen atom, an onium salt represented by Formula (1D), and an inorganic salt containing an anion whose conjugate acid has a pKa equal to or lower than −3.

4. The thermoelectric conversion element according to claim 1,
wherein $Z^{21}$ of the onium salt represented by Formula (2) is a nitrogen atom.

5. The thermoelectric conversion element according to claim 1,
wherein any of the nanocarbon material contained in the p-type thermoelectric conversion layer or the nanocarbon material contained in the n-type thermoelectric conversion layer contains carbon nanotubes.

6. The thermoelectric conversion element according to claim 1,
wherein any of the nanocarbon material contained in the p-type thermoelectric conversion layer or the nanocarbon material contained in the n-type thermoelectric conversion layer contains single-layer carbon nanotubes.

7. The thermoelectric conversion element according to claim 1,
wherein the difference between the ionization potential of the p-type thermoelectric conversion layer and the ionization potential of the n-type thermoelectric conversion layer is equal to or smaller than 0.10 eV.

8. The thermoelectric conversion element according to claim 1,
wherein the difference between the ionization potential of the p-type thermoelectric conversion layer and the ionization potential of the n-type thermoelectric conversion layer is 0.04 to 0.10 eV.

9. The thermoelectric conversion element according to claim 3,
wherein $Z^{21}$ of the onium salt represented by Formula (2) is a nitrogen atom.

10. The thermoelectric conversion element according to claim 2,
wherein any of the nanocarbon material contained in the p-type thermoelectric conversion layer or the nanocarbon material contained in the n-type thermoelectric conversion layer contains carbon nanotubes.

11. The thermoelectric conversion element according to claim 3,
wherein any of the nanocarbon material contained in the p-type thermoelectric conversion layer or the nanocarbon material contained in the n-type thermoelectric conversion layer contains carbon nanotubes.

12. The thermoelectric conversion element according to claim 4,
wherein any of the nanocarbon material contained in the p-type thermoelectric conversion layer or the nanocarbon material contained in the n-type thermoelectric conversion layer contains carbon nanotubes.

13. The thermoelectric conversion element according to claim 2,
wherein any of the nanocarbon material contained in the p-type thermoelectric conversion layer or the nanocarbon material contained in the n-type thermoelectric conversion layer contains single-layer carbon nanotubes.

14. The thermoelectric conversion element according to claim 3,
wherein any of the nanocarbon material contained in the p-type thermoelectric conversion layer or the nanocarbon material contained in the n-type thermoelectric conversion layer contains single-layer carbon nanotubes.

15. The thermoelectric conversion element according to claim 4,
wherein any of the nanocarbon material contained in the p-type thermoelectric conversion layer or the nanocarbon material contained in the n-type thermoelectric conversion layer contains single-layer carbon nanotubes.

* * * * *